United States Patent
Kim et al.

(10) Patent No.: US 10,978,650 B2
(45) Date of Patent: Apr. 13, 2021

(54) LIGHT-EMITTING DEVICE

(71) Applicant: Samsung Display Co., Ltd, Yongin-si (KR)

(72) Inventors: Dongchan Kim, Yongin-si (KR); Dongkyu Seo, Yongin-si (KR); Byoungduk Lee, Yongin-si (KR); Yoonhyeung Cho, Yongin-si (KR); Yongchan Ju, Yongin-si (KR); Wonsuk Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 646 days.

(21) Appl. No.: 15/472,764

(22) Filed: Mar. 29, 2017

(65) Prior Publication Data

US 2017/0352823 A1 Dec. 7, 2017

(30) Foreign Application Priority Data

Jun. 2, 2016 (KR) .................. 10-2016-0068850

(51) Int. Cl.
*H01L 51/54* (2006.01)
*H01L 51/00* (2006.01)
*H01L 51/50* (2006.01)

(52) U.S. Cl.
CPC ...... *H01L 51/0089* (2013.01); *H01L 51/5056* (2013.01); *H01L 51/5072* (2013.01); *H01L 2251/558* (2013.01)

(58) Field of Classification Search
None
See application file for complete search history.

(56) References Cited

U.S. PATENT DOCUMENTS

| | | | | |
|---|---|---|---|---|
| 6,395,409 B2 * | 5/2002 | Ueda | .................. | H01L 51/5092 313/505 |
| 2003/0059647 A1 * | 3/2003 | Thompson | ............. | C09K 11/06 428/690 |
| 2009/0078933 A1 * | 3/2009 | Koo | .................... | H01L 51/5052 257/40 |
| 2015/0136232 A1 | 5/2015 | Snaith et al. | | |

FOREIGN PATENT DOCUMENTS

| | | |
|---|---|---|
| CN | 1628491 | 6/2005 |
| CN | 104795505 A | 7/2015 |
| EP | 2942826 A2 | 11/2015 |
| JP | 2011-258416 A | 12/2011 |
| JP | 2014-082377 A | 5/2014 |
| WO | 2015/166006 A1 | 11/2015 |

OTHER PUBLICATIONS

Machine translation of JP2014-082377. (Year: 2014).*
Mitzi et al. Chem. Mater. 1997, 9, 2990-2995. (Year: 1997).*
Kim, Young-Hoon, et al., "Multicolored Organic/Inorganic Hybrid Perovskite Light-Emitting Diodes," Advanced Materials, vol. 27, Issue 7, 2015, pp. 1248-1254.
Yin, Wan-Jian, et al. "Unusual defect physics in CH3NH3PbI3 perovskite solar cell absorber," Applied Physics letters 104, 2014, pp. 063903-063903-4.

* cited by examiner

*Primary Examiner* — Andrew K Bohaty
(74) *Attorney, Agent, or Firm* — Kile Park Reed & Houtteman PLLC

(57) ABSTRACT

A light-emitting device is provided. The device includes a first electrode, a second electrode, an emission layer between the first electrode and the second electrode, a hole transport region between the first electrode and the emission layer, and an electron transport region between the emission layer and the second electrode. The hole transport region may include a hole transport layer, which in turn includes a first perovskite compound $[A^1{}_l][B^1{}_m][X^1]_n$ with a neutral defect. A hole concentration of the first perovskite compound may be from about $1.0 \times 10^{16}$ to about $9 \times 10^{18}$ cm$^{-3}$ at about 25° C.

21 Claims, 2 Drawing Sheets

LIGHT-EMITTING DEVICE

CROSS-REFERENCE TO RELATED APPLICATION

This application claims the benefit of Korean Patent Application No. 10-2016-0068850, filed on Jun. 2, 2016, in the Korean Intellectual Property Office, the disclosure of which is incorporated herein in its entirety by reference.

BACKGROUND

1. Field

One or more embodiments relate to light-emitting devices.

2. Description of the Related Art

Light-emitting devices operate based on the conversion of electrical energy to light energy. Light-emitting devices may include, for example, an organic light-emitting device using an organic material in an emission layer, and a quantum dot light-emitting device using quantum dots in an emission layer. Light emission characteristics of these light-emitting devices may be deteriorated by environmental oxygen or moisture. Such emission characteristics of light-emitting devices may be improved with a material having high chemical stability.

A perovskite compound refers to a material with the same 3-dimensional crystalline structure as calcium titanium oxide ($CaTiO_3$) (ideally having a cubic crystalline structure). The perovskite compound has a simple structure and good chemical stability, and thus may be useful in a variety of electronic devices such as light-emitting devices.

SUMMARY

One or more embodiments include a high-quality light-emitting device.

Additional aspects will be set forth in part in the description which follows and, in part, will be apparent from the description, or may be learned by practice of the presented embodiments.

According to one or more embodiments, a light-emitting device includes: a first electrode; a second electrode opposite to the first electrode; an emission layer between the first electrode and the second electrode; a hole transport region between the first electrode and the emission layer; and an electron transport region between the emission layer and the second electrode, wherein the hole transport region includes a hole transport layer, the hole transport layer comprises a first perovskite compound with a neutral defect, a hole concentration of the first perovskite compound is from about $1.0 \times 10^{16}$ to about $9 \times 10^{18}$ cm$^{-3}$ at about 25° C., and the first perovskite compound is represented by Formula 1:

$$[A^1{}_l][B^1{}_m][X^1]_n \qquad \text{<Formula 1>}$$

wherein, in Formula 1, $A^1$ is at least one monovalent organic cation, at least one monovalent inorganic cation, or any combination thereof, $B^1$ is $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Lu^{2+}$, or any combination thereof, $X^1$ is at least one monovalent anion, l, m, and n are each independently a real number greater than 0 and smaller than or equal to 10, and l+2m=n.

According to one or more embodiments, a light-emitting device includes: a first electrode; a second electrode opposite to the first electrode; an emission layer between the first electrode and the second electrode; a hole transport region between the first electrode and the emission layer; and an electron transport region between the emission layer and the second electrode, wherein the electron transport region includes an electron transport layer, the electron transport layer comprises a second perovskite compound with a neutral defect, an electron concentration of the second perovskite compound is from about $1.0 \times 10^{16}$ to about $9 \times 10^{18}$ cm$^{-3}$ at about 25° C., and the second perovskite compound is represented by Formula 2:

$$[A^2{}_o][B^2{}_p][X^2]_q \qquad \text{<Formula 2>}$$

wherein, in Formula 2, $A^2$ is at least one monovalent organic cation, at least one monovalent inorganic cation, or any combination thereof, $B^2$ is $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Lu^{2+}$, or any combination thereof, $X^2$ is at least one monovalent anion, o, p, and q are each independently a real number greater than 0 and smaller than or equal to 10, and o+2p=q.

According to one or more embodiments, a light-emitting device includes: a first electrode; a second electrode opposite to the first electrode; an emission layer between the first electrode and the second electrode; a hole transport region between the first electrode and the emission layer; and an electron transport region between the emission layer and the second electrode, wherein the hole transport region includes a hole transport layer, the electron transport region includes an electron transport layer, the hole transport layer includes a first perovskite compound with a neutral defect, the electron transport layer includes a second perovskite compound with a neutral defect, a hole concentration of the first perovskite compound is from about $1.0 \times 10^{16}$ to about $9 \times 10^{18}$ cm$^{-3}$ at about 25° C., the first perovskite compound is represented by Formula 1, an electron concentration of the second perovskite compound is from about $1.0 \times 10^{16}$ to about $9 \times 10^{18}$ cm$^{-3}$ at about 25° C., and the second perovskite compound is represented by Formula 2:

$$[A^1{}_l][B^1{}_m][X^1]_n \qquad \text{<Formula 1>}$$

$$[A^2{}_o][B^2{}_p][X^2]_q \qquad \text{<Formula 2>}$$

wherein, in Formulae 1 and 2, $A^1$ and $A^2$ are each independently at least one monovalent organic cation, at least one monovalent inorganic cation, or any combination thereof, $B^1$ and $B^2$ are each independently $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Lu^{2+}$, or any combination thereof, $X^1$ and $X^2$ are each independently at least one monovalent anion, l, m, n, o, p, and q are each independently a real number greater than 0 and smaller than or equal to 10, l+2m=n, and o+2p=q.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
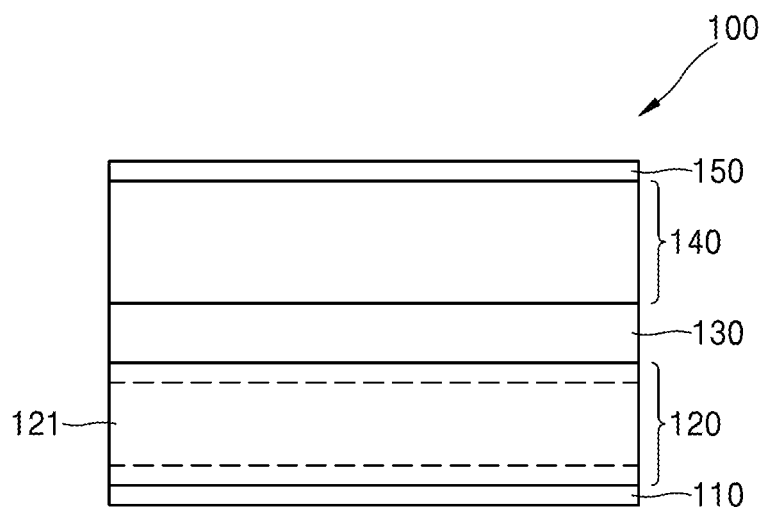
FIG. 1 is a schematic cross-sectional view of a light-emitting device according to an embodiment.

The present disclosure will now be described more fully with reference to the accompanying drawings, in which exemplary embodiments are shown. The invention may, However, be embodied in many different forms and should not be construed as being limited to the embodiments set forth herein; rather, these embodiments are provided so that this disclosure will be thorough and complete, and will fully convey the effects and features of the present disclosure and ways to implement the present disclosure will fully convey the concept of the invention to those skilled in the art.

In the drawings, like reference numerals denote like elements throughout, and thus redundant description thereof will be omitted.

It will also be understood that when an element such as a layer, a region or a component is referred to as being "on" another layer or element, it can be "directly on" the other layer or element, or intervening layers, regions, or components may also be present. In the drawings, the sizes of elements are exaggerated or reduced for ease of description. The size or thickness of each element shown in the drawings are arbitrarily illustrated for better understanding or ease of description, and thus the present disclosure is not limited thereto.

Although the terms "first", "second", etc., may be used herein to describe various elements, components, regions, and/or layers, these elements, components, regions, and/or layers should not be limited by these terms. These terms are used only to distinguish one component from another, not for purposes of limitation.

As used herein, the singular forms "a", "an", and "the" are intended to include the plural forms as well, unless the context clearly indicates otherwise.

As used herein, terms such as "including", "having", or the like are intended to indicate the existence of the features or elements disclosed in the specification, and are not intended to preclude the possibility that one or more other features or elements may exist or may be added.

As used herein, the term "perovskite compound" refers to a compound represented by, for example, the formula of $ABX_3$, wherein A and B are cations having different sizes, and X is an anion. In the unit cell of the perovskite compound, a site of the cation A may be at (0,0,0), a site of the cation B may be at (1/2,1/2,1/2), and a site of the anion X may be at (1/2,1/2,0). A perovskite compound may have a twisted structure with lower symmetry, compared to the idealized symmetric structure of calcium titanium oxide ($CaTiO_3$), depending on types of A, B, and X. It will be understood that the perovskite compound used herein may encompass a compound having the ideal symmetric structure and a compound having a twisted structure with low symmetry.

According to an embodiment of the present disclosure, a light-emitting device includes: a first electrode; a second electrode opposite to the first electrode; an emission layer between the first electrode and the second electrode; a hole transport region between the first electrode and the emission layer; and an electron transport region between the emission layer and the second electrode, wherein the hole transport region may include a hole transport layer, the hole transport layer may include a first perovskite compound with a neutral defect, a hole concentration of the first perovskite compound may be from about $1.0 \times 10^{16}$ to about $9 \times 10^{18}$ cm$^{-3}$ at about 25° C., and the first perovskite compound may be represented by Formula 1:

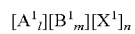  <Formula 1> wherein, in Formula 1, $A^1$ may be at least one monovalent organic cation, at least one monovalent inorganic cation, or any combination thereof, $B^1$ may be $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Lu^{2+}$, or any combination thereof, $X^1$ may be at least one monovalent anion, l, m, and n may be each independently a real number greater than 0 and smaller than or equal to 10, and l+2m=n.

In some embodiments, the hole transport region may further include a hole control layer. However, embodiments are not limited thereto.

For example, the hole control layer may be between the first electrode and the hole transport layer, or between the hole transport layer and the emission layer. However, embodiments are not limited thereto.

In some embodiments, the hole transport region may further include a first hole control layer between the first electrode and the hole transport layer; and a second hole control layer between the hole transport layer and the emission layer. However, embodiments are not limited thereto.

According to an embodiment of the present disclosure, a light-emitting device includes: a first electrode; a second electrode opposite to the first electrode; an emission layer between the first electrode and the second electrode; a hole transport region between the first electrode and the emission layer; and an electron transport region between the emission layer and the second electrode, wherein the electron transport region may include an electron transport layer, the electron transport layer may include a second perovskite compound with a neutral defect, an electron concentration of the second perovskite compound may be from about $1.0 \times 10^{16}$ to about $9 \times 10^{18}$ cm$^{-3}$ at about 25° C., and the second perovskite compound may be represented by Formula 2:

$$[A^2{}_o][B^2{}_p][X^2]_q \quad \text{<Formula 2>}$$

wherein, in Formula 2, $A^2$ may be at least one monovalent organic cation, at least one monovalent inorganic cation, or any combination thereof, $B^2$ may be $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Lu^{2+}$, or any combination thereof, $X^2$ may be at least one monovalent anion, o, p, and q may be each independently a real number greater than 0 and smaller than or equal to 10, and o+2p=q.

In some embodiments, the electron transport region may further include an electron control layer. However, embodiments are not limited thereto.

For example, the electron control layer may be between the second electrode and the electron transport layer, or between the electron transport layer and the emission layer. However, embodiments are not limited thereto.

In some embodiments, the electron transport region further includes a first electron control layer between the second electrode and the electron transport layer; and a second electron control layer between the electron transport layer and the emission layer. However, embodiments are not limited thereto.

According to an embodiment of the present disclosure, a light-emitting device includes: a first electrode; a second electrode opposite to the first electrode; an emission layer between the first electrode and the second electrode; a hole transport region between the first electrode and the emission layer; and an electron transport region between the emission layer and the second electrode, wherein the hole transport region may include a hole transport layer, the electron transport region may include an electron transport layer, the hole transport layer may include a first perovskite compound with a neutral defect, the electron transport layer may include a second perovskite compound with a neutral defect, a hole concentration of the first perovskite compound may be from about $1.0 \times 10^{16}$ to about $9 \times 10^{18}$ cm$^{-3}$ at about 25° C., the first perovskite compound may be represented by Formula 1, an electron concentration of the second perovskite compound may be from about $1.0 \times 10^{16}$ to about $9 \times 10^{18}$ cm$^{-3}$ at about 25° C., and the second perovskite compound may be represented by Formula 2:

$$[A^1{}_l][B^1{}_m][X^1]_n \quad \text{<Formula 1>}$$

$$[A^2{}_o][B^2{}_p][X^2]_q \quad \text{<Formula 2>}$$

wherein, in Formulae 1 and 2, $A^1$ and $A^2$ may be each independently at least one monovalent organic cation, at least one monovalent inorganic cation, or any combination thereof, $B^1$ and $B^2$ may be each independently $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Lu^{2+}$, or any combination thereof, $X^1$ and $X^2$ may be each independently at least one monovalent anion, l, m, n, o, p, and q may be each independently a real number greater than 0 and smaller than or equal to 10, l+2m=n, and o+2p=q.

In some embodiments, the hole transport region may further include a hole control layer. However, embodiments are not limited thereto.

For example, the hole control layer may be between the first electrode and the hole transport layer, or between the hole transport layer and the emission layer. However, embodiments are not limited thereto.

In some embodiments, the hole transport region may further include: a first hole control layer between the first electrode and the hole transport layer; and a second hole control layer between the hole transport layer and the emission layer. However, embodiments are not limited thereto.

In some embodiments, the electron transport region may further include an electron control layer. However, embodiments are not limited thereto.

For example, the electron control layer may be between the second electrode and the electron transport layer, or between the electron transport layer and the emission layer. However, embodiments are not limited thereto.

In some embodiments, the electron transport region may further include a first electron control layer between the second electrode and the electron transport layer; and a second electron control layer between the electron transport layer and the emission layer. However, embodiments are not limited thereto.

The first perovskite compound and the second perovskite compound in the above-described embodiments will be described in greater detail below.

In the above-described embodiments, the electron control layer and the hole control layer may each independently include at least one selected from an alkaline metal halide, an alkaline earth metal halide, and a rare earth metal halide. However, embodiments are not limited thereto.

For example, the electron control layer and the hole control layer may each independently include at least one selected from LiF, NaF, KF, RbF, CsF, LiI, NaI, KI, RbI, and CsI. However, embodiments are not limited thereto.

Hereinafter, a structure of a light-emitting device according to an embodiment and a method of manufacturing the same now will be described with reference to FIG. 1.

FIG. 1 is a schematic cross-sectional view of a light-emitting device 100 according to an embodiment.

Referring to FIG. 1, a light-emitting device 100 according to an embodiment may include a first electrode 110, a hole transport region 120, an emission layer 130, an electron transport region 140, and a second electrode 150.

In the light-emitting device 100 of FIG. 1, a substrate (not shown) may be further disposed under the first electrode 110 or on the second electrode 150. The substrate may be, for example, a glass substrate or a transparent plastic substrate with strong mechanical strength, thermal stability, transparency, surface smoothness, ease of handling, and water resistance.

For example, the first electrode 110 may be formed by depositing or sputtering a first electrode-forming material on the substrate. When the first electrode 110 is an anode, a material having a high work function may be selected as a material for the first electrode 110 to facilitate hole injection.

The first electrode 110 may be a reflective electrode, a semi-transmissive electrode, or a transmissive electrode. To form the first electrode 110 as a transmissive electrode, a material for the first electrode 110 may be selected from indium tin oxide (ITO), indium zinc oxide (IZO), tin oxide (SnO$_2$), zinc oxide (ZnO), and any combination thereof. However, embodiments are not limited thereto. To form the first electrode 110 as a semi-transmissive or a reflective electrode, a material for the first electrode 110 may be selected from magnesium (Mg), silver (Ag), aluminum (Al), aluminum-lithium (Al—Li), calcium (Ca), magnesium-indium (Mg—In), magnesium-silver (Mg—Ag), and any combination thereof. However, embodiments are not limited thereto.

The first electrode 110 may have a single-layer structure or a multi-layer structure including a plurality of layers. For example, the first electrode 110 may have a three-layered structure including ITO, Ag, and ITO layers. However, embodiments are not limited thereto.

The hole transport region 120 may have i) a single-layer structure including a single layer consisting of a single material, ii) a single-layer structure including a single layer consisting of a plurality of different materials, or iii) a multi-layer structure including a plurality of layers consisting of different materials.

The hole transport region 120 may include a hole transport layer 121. The hole transport region 120 may further include at least one layer selected from a hole injection layer (HIL), an emission auxiliary layer, an electron blocking layer (EBL), and a hole control layer.

For example, the hole transport region 120 may have a single-layer structure including a single layer consisting of a single material (for example, a single-layer structure including a hole transport layer consisting of a single material), a single-layer structure including a single layer consisting of a plurality of different materials, or a multi-layer structure including a plurality of layers, for example, as a stack of a hole control layer/hole transport layer, a stack of a hole transport layer/hole control layer, or a stack of a first hole control layer/hole transport layer/second hole control layer, wherein the layers in each stack may be sequentially stacked upon one another in the stated order on the first electrode 110. However, embodiments are not limited thereto.

The hole transport layer 121 may include a first perovskite compound with a neutral defect.

When a perovskite compound with a neutral defect is represented by, for example, the formula of $ABX_3$, the neutral defect may be any neutral defect selected from the following types (a) to (l).

(a) where the unit has a vacancy in which A is absent ($V_A$);
(b) where the unit has a vacancy in which B is absent ($V_B$);
(c) where the unit has a vacancy in which X is absent ($V_X$);
(d) where A is further added to the unit cell (Ai);
(e) where B is further added to the unit cell (Bi);
(f) where X is further added to the unit cell (Xi);
(g) where a B site in the unit cell is substituted by A ($A_B$);
(h) where an A site in the unit cell is substituted by B ($B_A$);
(i) where an X site in the unit cell is substituted by A ($A_X$);
(j) where an X site in the unit cell is substituted by B ($B_X$);
(k) where an A site in the unit cell is substituted by X ($X_A$); and
(l) where a B site in the unit cell is substituted by X ($X_B$).

In some embodiments, the perovskite compound perovskite compound may include at least two neutral defects selected from the above-described types of (a) to (l). However, embodiments are not limited thereto.

A hole concentration of the first perovskite compound may be from about $1.0\times10^{16}$ to about $9\times10^{18}$ cm$^{-3}$ at about 25° C. For example, a hole concentration of the first perovskite compound may be from about $1.0\times10^{16}$ to about $9\times10^{17}$ cm$^{-3}$ at about 25° C. However, embodiments are not limited thereto. When the hole concentration of the first perovskite compound is within these ranges, hole injection barriers may be reduced so that the emission layer may have improved electron-hole balance.

The first perovskite compound may be represented by Formula 1:

$$[A^1{}_l][B^1{}_m][X^1]_n \qquad \text{<Formula 1>}$$

In Formula 1, $A^1$ may be at least one monovalent organic cation, at least one monovalent inorganic cation, or any combination thereof, $B^1$ may be $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Lu^{2+}$, or any combination thereof, $X^1$ may be at least one monovalent anion, l, m, and n may be each independently a real number greater than 0 and smaller than or equal to 10, and l+2m=n.

For example, in Formula 1, $A^1$ may be i) a monovalent organic cation, ii) a monovalent inorganic cation, iii) a combination of at least two different monovalent organic cations, iv) any combination of at least two different monovalent inorganic cations, or v) any combination of a monovalent organic cation and a monovalent inorganic cation.

In some embodiments, in Formula 1, $A^1$ may be $(R_1R_2R_3C)^+$, $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)—NR_4R_5)^+$, a substituted or unsubstituted nitrogen-containing 5-membered cyclic monovalent cation, a substituted or unsubstituted nitrogen-containing 6-membered cyclic monovalent cation, a substituted or unsubstituted 7-membered cyclic monovalent cation, Li$^+$, Na$^+$, K$^+$, Rb$^+$, Cs$^+$, Fr$^+$, or any combination thereof, $R_1$ to $R_5$, at least one substituent of the substituted nitrogen-containing 5-membered cyclic monovalent cation, at least one substituent of the substituted nitrogen-containing 6-membered cyclic monovalent cation, and at least one substituent of the substituted 7-membered cyclic monovalent cation may be each independently selected from a hydrogen, a deuterium (-D), —F, —Cl, —Br, —I, a hydroxyl group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_6$-$C_{20}$ aryl group, and —N($Q_1$)($Q_2$), and $Q_1$ and $Q_2$ may be each independently selected from a hydrogen, a deuterium, a hydroxyl group, a $C_1$-$C_{20}$ alkyl group, a $C_2$-$C_{20}$ alkenyl group, a $C_2$-$C_{20}$ alkynyl group, a $C_1$-$C_{20}$ alkoxy group, and a $C_6$-$C_{20}$ aryl group. However, embodiments are not limited thereto.

As used herein, the terms "nitrogen-containing 5-membered cyclic" and "nitrogen-containing 6-membered cyclic" refer to an organic cyclic group including at least one nitrogen (N) and at least one carbon (C) as ring-member atoms. The term "7-membered cyclic" refers to an organic cyclic group including carbon (C) as a ring-member atom.

For example, a "nitrogen-containing 5-membered cyclic" group may be an imidazole, a pyrazole, a thiazole, an oxazole, a pyrrolidine, a pyrroline, a pyrrole, or a triazole, and a "nitrogen-containing 6-membered cyclic" group may be a pyridine, a pyridazine, a pyrimidine, a pyrazine, or a piperidine. A "7-membered cyclic" group may be a cycloheptatriene. However, embodiments are not limited thereto.

For example, in Formula 1, $A^1$ may be $(R_1R_2R_3C)^+$, $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)—NR_4R_5)^+$, a substituted or unsubstituted cycloheptatrienium, a substituted or unsubstituted imidazolium, a substituted or unsubstituted pyridinium, a substituted or unsubstituted pyridazinium, a substituted or unsubstituted pyrimidinium, a substituted or unsubstituted pyrazinium, a substituted or unsubstituted pyrazolium, a substituted or unsubstituted thiazolium, a substituted or unsubstituted oxazolium, a substituted or unsubstituted piperidinium, a substituted or unsubstituted pyrrolidinium, a substituted or unsubstituted pyrrolinium, a substituted or unsubstituted pyrrolium, a substituted or unsubstituted triazolium, $Li^+$, $Na^+$, $K^+$, $Rb^+$, $Cs^+$, $Fr^+$, or any combination thereof;

$R_1$ to $R_5$, at least one substituent of the substituted imidazolium, at least one substituent of the substituted pyridinium, at least one substituent of the substituted pyridazinium, at least one substituent of the substituted pyrimidinium, at least one substituent of the substituted pyrazinium, at least one substituent of the substituted pyrazolium, at least one substituent of the substituted thiazolium, at least one substituent of the substituted oxazolium, at least one substituent of the substituted piperidinium, at least one substituent of the substituted pyrrolidinium, at least one substituent of the substituted pyrrolinium, at least one substituent of the substituted pyrrolium, and at least one substituent of the substituted triazolium may be each independently selected from a hydrogen, a deuterium, —F, —Cl, —Br, —I, a hydroxyl group, a $C_1$-$C_{20}$ alkyl group, a $C_2$-$C_{10}$ alkenyl group, a $C_2$-$C_{10}$ alkynyl group, and a $C_1$-$C_{20}$ alkoxy group, a $C_1$-$C_{20}$ alkyl group, a $C_2$-$C_{10}$ alkenyl group, a $C_2$-$C_{10}$ alkynyl group, and a $C_1$-$C_{20}$ alkoxy group, each substituted with at least one selected from a deuterium, —F, —Cl, —Br, —I, and a hydroxyl group, a phenyl group, a naphthyl group, a biphenyl group, and a terphenyl group, a phenyl group, a naphthyl group, a biphenyl group, and a terphenyl group, each substituted with at least one selected from a deuterium, —F, —Cl, —Br, —I, a hydroxyl group, a $C_1$-$C_{20}$ alkyl group, a $C_2$-$C_{10}$ alkenyl group, a $C_2$-$C_{10}$ alkynyl group, and a $C_1$-$C_{20}$ alkoxy group, and —N($Q_1$)($Q_2$), and $Q_1$ and $Q_2$ may be each independently selected from a hydrogen, a deuterium, a $C_1$-$C_{20}$ alkyl group, a $C_2$-$C_{10}$ alkenyl group, a $C_2$-$C_{10}$ alkynyl group, a $C_1$-$C_{20}$ alkoxy group, a phenyl group, a naphthyl group, a biphenyl group, and a terphenyl group. However, embodiments are not limited thereto.

In some embodiments, in Formula 1, $A^1$ may be $(R_1R_2R_3R_4N)^+$, $(R_1R_2R_3R_4P)^+$, $(R_1R_2R_3R_4As)^+$, $(R_1R_2R_3R_4Sb)^+$, a substituted or unsubstituted cycloheptatrienium, $Li^+$, $Na^+$, $K^+$, $Rb^+$, $Cs^+$, $Fr^+$, or any combination thereof;

$R_1$ to $R_4$, and at least one substituent of the substituted cycloheptatrienium may be each independently selected from a hydrogen, a deuterium, —F, —Cl, —Br, —I, a hydroxyl group, a $C_1$-$C_{20}$ alkyl group, a $C_2$-$C_{10}$ alkenyl group, a $C_2$-$C_{10}$ alkynyl group, a $C_1$-$C_{20}$ alkoxy group, and —N($Q_1$)($Q_2$); and $Q_1$ and $Q_2$ may be each independently selected from a hydrogen, a deuterium, a $C_1$-$C_{20}$ alkyl group, a $C_2$-$C_{10}$ alkenyl group, a $C_2$-$C_{10}$ alkynyl group, and a $C_1$-$C_{20}$ alkoxy group. However, embodiments are not limited thereto.

In some embodiments, in Formula 1, $A^1$ may be $(CH_3NH_3)^+$, $(C_2H_6PH_2)^+$, $(CH_3AsH_3)^+$, $(NH_4)^+$, $(CH_3SbH_3)^+$, $(C_2H_6NH_2)^+$, $(PH_4)^+$, $(CH_2N_2H_4)^+$, $(PF_4)^+$, $(CH_3PH_3)^+$, $(C_7H_7)^+$, $(SbH_4)^+$, $(AsH_4)^+$, $(NCl_4)^+$, $(NH_3OH)^+$, $(NH_3NH_2)^+$, $(CH(NH_2)_2)^+$, $(C_3N_2H_5)^+$, $((CH_3)_2NH_2)^+$, $(NC_4H_8)^+$, $((CH_3CH_2)NH_3)^+$, $(NH_2)_3C)^+$, $Li^+$, $Na^+$, $K^+$, $Rb^+$, $Cs^+$, $Fr^+$, or any combination thereof. However, embodiments are not limited thereto.

In some embodiments, in Formula 1, $A^1$ may be $(CH_3NH_3)^+$, $K^+$, $Rb^+$, $Cs^+$, or any combination thereof. However, embodiments are not limited thereto.

For example, in Formula 1, $B^1$ may be $Eu^{2+}$. However, embodiments are not limited thereto.

For example, the first perovskite compound may not comprise $Pb^{2+}$ and/or $Sn^{2+}$. However, embodiments are not limited thereto. The first perovskite compound not including $Pb^{2+}$ and/or $Sn^{2+}$ may be environmentally safe.

For example, in Formula 1, $X^1$ may be i) a monovalent anion, or ii) any combination of at least two different monovalent anions. However, embodiments are not limited thereto.

In some embodiments, in Formula 1, $X^1$ may be $F^-$, $Cl^-$, $Br^-$, $I^-$, or any combination thereof. However, embodiments are not limited thereto.

In some other embodiments, in Formula 1, $X^2$ may be $I^-$. However, embodiments are not limited thereto.

For example, in Formula 1, l, m, and n may be each independently a real number from 0.1 to 3. However, embodiments are not limited thereto.

In some embodiments, in Formula 1,
l may be 1, m may be 1, and n may be 3;
l may be 1, m may be 0.5, and n may be 2;
l may be 1, m may be 0.67, and n may be 2.33; or
l may be 1, m may be 0.75, and n may be 2.5. However, embodiments are not limited thereto.

In some embodiments, the first perovskite compound of Formula 1 may have a neutral defect, and may be selected from $[CH_3NH_3][Eu][I]_3$, $[CH_3NH_3][Pb_rEu_{(1-r)}][I]_3$, $[CH_3NH_3][Pb_rYb_{(1-r)}][I]_3$, $[CH_3NH_3][Pb_rTm_{(1-r)}][I]_3$, $[CH_3NH_3][Pb_rLa_{(1-r)}][I]_3$, $[CH_3NH_3][Pb_rCe_{(1-r)}][I]_3$, $[CH_3NH_3][Pb_rPr_{(1-r)}][I]_3$, $[CH_3NH_3][Pb_rNd_{(1-r)}][I]_3$, $[CH_3NH_3][Pb_rPm_{(1-r)}][I]_3$, $[CH_3NH_3][Pb_rGd_{(1-r)}][I]_3$, $[CH_3NH_3][Pb_rTb_{(1-r)}][I]_3$, $[CH_3NH_3][Pb_rHo_{(1-r)}][I]_3$ and $[CH_3NH_3][Pb_rEr_{(1-r)}][I]_3$;

$[Cs][Pb_rEu_{(1-r)}][I]_3$, $[Cs][Pb_rYb_{(1-r)}][I]_3$, $[Cs][Pb_rTm_{(1-r)}][I]_3$, $[Cs][Pb_rLa_{(1-r)}][I]_3$, $[Cs][Pb_rCe_{(1-r)}][I]_3$, $[Cs][Pb_rPr_{(1-r)}][I]_3$, $[Cs][Pb_rNd_{(1-r)}][I]_3$, $[Cs][Pb_rPm_{(1-r)}][I]_3$, $[Cs][Pb_rGd_{(1-r)}][I]_3$, $[Cs][Pb_rTb_{(1-r)}][I]_3$, $[Cs][Pb_rHo_{(1-r)}][I]_3$ and $[Cs][Pb_rEr_{(1-r)}][I]_3$;

$[CH_3NH_3][Sn_rEu_{(1-r)}][I]_3$, $[CH_3NH_3][Sn_rYb_{(1-r)}][I]_3$, $[CH_3NH_3][Sn_rTm_{(1-r)}][I]_3$, $[CH_3NH_3][Sn_rLa_{(1-r)}][I]_3$, $[CH_3NH_3][Sn_rCe_{(1-r)}][I]_3$, $[CH_3NH_3][Sn_rPr_{(1-r)}][I]_3$, $[CH_3NH_3][Sn_rNd_{(1-r)}][I]_3$, $[CH_3NH_3][Sn_rPm_{(1-r)}][I]_3$, $[CH_3NH_3][Sn_rGd_{(1-r)}][I]_3$, $[CH_3NH_3][Sn_rTb_{(1-r)}][I]_3$, $[CH_3NH_3][Sn_rHo_{(1-r)}][I]_3$ and $[CH_3NH_3][Sn_rEr_{(1-r)}][I]_3$;

$[Cs][Sn_rEu_{(1-r)}][I]_3$, $[Cs][Sn_rYb_{(1-r)}][I]_3$, $[Cs][Sn_rTm_{(1-r)}][I]_3$, $[Cs][Sn_rLa_{(1-r)}][I]_3$, $[Cs][Sn_rCe_{(1-r)}][I]_3$, $[Cs][Sn_rPr_{(1-r)}][I]_3$, $[Cs][Sn_rNd_{(1-r)}][I]_3$, $[Cs][Sn_rPm_{(1-r)}][I]_3$, $[Cs][Sn_rGd_{(1-r)}][I]_3$, $[Cs][Sn_rTb_{(1-r)}][I]_3$, $[Cs][Sn_rHo_{(1-r)}][I]_3$ and $[Cs][Sn_rEr_{(1-r)}][I]_3$;

$[Rb][Pb_rEu_{(1-r)}][I]_3$, $[Rb][Pb_rYb_{(1-r)}][I]_3$, $[Rb][Pb_rTm_{(1-r)}][I]_3$, $[Rb][Pb_rLa_{(1-r)}][I]_3$, $[Rb][Pb_rCe_{(1-r)}][I]_3$, $[Rb][Pb_rPr_{(1-r)}][I]_3$, $[Rb][Pb_rNd_{(1-r)}][I]_3$, $[Rb][Pb_rPm_{(1-r)}][I]_3$, $[Rb][Pb_rGd_{(1-r)}][I]_3$, $[Rb][Pb_rTb_{(1-r)}][I]_3$, $[Rb][Pb_rHo_{(1-r)}][I]_3$ and $[Rb][Pb_rEr_{(1-r)}][I]_3$;

$[Rb][Sn_rEu_{(1-r)}][I]_3$, $[Rb][Sn_rYb_{(1-r)}][I]_3$, $[Rb][Sn_rTm_{(1-r)}][I]_3$, $[Rb][Sn_rLa_{(1-r)}][I]_3$, $[Rb][Sn_rCe_{(1-r)}][I]_3$, $[Rb][Sn_rPr_{(1-r)}][I]_3$, $[Rb][Sn_rNd_{(1-r)}][I]_3$, $[Rb][Sn_rPm_{(1-r)}][I]_3$, $[Rb][Sn_rGd_{(1-r)}][I]_3$, $[Rb][Sn_rTb_{(1-r)}][I]_3$, $[Rb][Sn_rHo_{(1-r)}][I]_3$ and $[Rb][Sn_rEr_{(1-r)}][I]_3$;

$[K][Pb_rEu_{(1-r)}][I]_3$, $[K][Pb_rYb_{(1-r)}][I]_3$, $[K][Pb_rTm_{(1-r)}][I]_3$, $[K][Pb_rLa_{(1-r)}][I]_3$, $[K][Pb_rCe_{(1-r)}][I]_3$, $[K][Pb_rPr_{(1-r)}]$ $[I]_3$, $[K][Pb_rNd_{(1-r)}][I]_3$, $[K][Pb_rPm_{(1-r)}][I]_3$, $[K][Pb_rGd_{(1-r)}]$ $[I]_3$, $[K][Pb_rTb_{(1-r)}][I]_3$, $[K][Pb_rHo_{(1-r)}][I]_3$ and $[K]$ $[Pb_rEr_{(1-r)}][I]_3$;

$[K][Sn_rEu_{(1-r)}][I]_3$, $[K][Sn_rYb_{(1-r)}][I]_3$, $[K][Sn_rTm_{(1-r)}]$ $[I]_3$, $[K][Sn_rLa_{(1-r)}][I]_3$, $[K][Sn_rCe_{(1-r)}][I]_3$, $[K][Sn_rPr_{(1-r)}]$ $[I]_3$, $[K][Sn_rNd_{(1-r)}][I]_3$, $[K][Sn_rPm_{(1-r)}][I]_3$, $[K][Sn_rGd_{(1-r)}]$ $[I]_3$, $[K][Sn_rTb_{(1-r)}][I]_3$, $[K][Sn_rHo_{(1-r)}][I]_3$ and $[K]$ $[Sn_rEr_{(1-r)}][I]_3$;

$[CH_3NH_3][Tm_rEu_{(1-r)}][I]_3$, $[CH_3NH_3][Tm_rYb_{(1-r)}][I]_3$, $[CH_3NH_3][Tm_rTm_{(1-r)}][I]_3$, $[CH_3NH_3][Tm_rLa_{(1-r)}][I]_3$, $[CH_3NH_3][Tm_rCe_{(1-r)}][I]_3$, $[CH_3NH_3][Tm_rPr_{(1-r)}][I]_3$, $[CH_3NH_3][Tm_rNd_{(1-r)}][I]_3$, $[CH_3NH_3][Tm_rPm_{(1-r)}][I]_3$, $[CH_3NH_3][Tm_rGd_{(1-r)}][I]_3$, $[CH_3NH_3][Tm_rTb_{(1-r)}][I]_3$, $[CH_3NH_3][Tm_rHo_{(1-r)}][I]_3$ and $[CH_3NH_3][Tm_rEr_{(1-r)}][I]_3$; and $[Cs][Tm_rEu_{(1-r)}][I]_3$, $[Cs][Tm_rYb_{(1-r)}][I]_3$, $[Cs][Tm_rTm_{(1-r)}][I]_3$, $[Cs][Tm_rLa_{(1-r)}][I]_3$, $[Cs][Tm_rCe_{(1-r)}][I]_3$, $[Cs][Tm_rPr_{(1-r)}][I]_3$, $[Cs][Tm_rNd_{(1-r)}][I]_3$, $[Cs][Tm_rPm_{(1-r)}]$ $[I]_3$, $[Cs][Tm_rGd_{(1-r)}][I]_3$, $[Cs][Tm_rTb_{(1-r)}][I]_3$, $[Cs]$ $[Tm_rHo_{(1-r)}][I]_3$ and $[Cs][Tm_rEr_{(1-r)}][I]_3$, wherein r is a real number from 0.1 to 1. However, embodiments are not limited thereto.

The first perovskite compound may include essentially a lanthanum-based metal, for example, europium (Eu). The lanthanum-based metal may be present as a divalent cation or trivalent cation in the first perovskite compound, and thus may improve electrical conductivity of the first perovskite compound.

The first perovskite compound represented by Formula 1 may have any form, not limited to a specific form. For example, the first perovskite compound represented by Formula 1 may be in the form of nanoparticles, nanowires, a nanolayer, multiple nanolayers, microparticles, microwires, a microlayer, or multiple microlayers.

The hole transport layer 121 including the first perovskite compound represented by Formula 1 may be formed by supplying a $A^1$-containing precursor and a $B^1$-containing precursor onto the first electrode 110 and at the same time or sequentially performing thermal treatment.

For example, the hole transport layer 121 including the first perovskite compound represented by Formula 1 may be formed by supplying a $A^1$-containing precursor and a $B^1$-containing precursor onto the first electrode 110 and at the same time performing thermal treatment (i.e., one-step method).

For example, the hole transport layer 121 including the first perovskite compound represented by Formula 1 may be formed by supplying a $A^1$-containing precursor and a $B^1$-containing precursor onto the first electrode 110 to form a precursor-containing layer and then thermally treating the precursor-containing layer (i.e., two-step method).

In the $A^1$-containing precursor and the $B^1$-containing precursor, $A^1$ and $B^1$ may be defined the same as those described in connection with Formula 1.

For example, the $A^1$-containing precursor may be selected from halides of $A^1$ (for example, $(A^1)(X^1)$), and the $B^1$-containing precursor may be selected from halides of $B^1$ (for example, $(B^1)(X^1)_2$). In the $(A^1)(X^1)$ and $(B^1)(X^1)_2$, $A^1$ and $B^1$ may be defined the same as those described in connection with Formula 1, and $X^1$ may be selected from —F, —Cl, —Br, and —I.

The neutral defect of the first perovskite compound represented by Formula 1) may be controlled by adjustment of a mole ratio of $(A^1)(X^1)$ and $(B^1)(X^1)_2$ during forming of the hole transport layer 121. For example, the first perovskite compound represented by Formula 1 may have a neutral defect selected from the above-described types of (a), (b), (f), (g), (k), and (l) by adjusting a molar ratio of $(A^1)(X^1)$ to $(B^1)(X^1)_2$ to be less than 1.

During forming of the hole transport layer 121, the thermal treatment conditions may be varied depending on whether $A^1$ in the $A^1$-containing precursor includes a monovalent inorganic cation or not.

For example, the thermal treatment conditions for forming the hole transport layer may be selected from i) a temperature of about 100° C. to about 400° C. and a duration of about 15 minutes to 1 hour when $A^1$ does not includes a monovalent inorganic cation, and ii) a temperature of about 400° C. to about 800° C. and a duration of about 2 hours to 48 hours when $A^1$ includes a monovalent inorganic cation. However, embodiments are not limited thereto.

The thickness of the hole transport region may be from about 100 Å to about 10,000 Å, and in some embodiments, from about 100 Å to about 1,000 Å. The thickness of the hole transport layer may be from about 50 Å to about 2,000 Å, and in some embodiments, from about 100 Å to about 1,500 Å. When the thicknesses of the hole transport region and the hole transport layer are within these ranges, satisfactory hole transport characteristics may be obtained without a substantial increase in driving voltage.

The hole control layer may facilitate hole injection at the interface between the first electrode, the hole transport layer, and/or the emission layer, and thus improved hole-electron balance in the emission layer.

The hole control layer may include at least one selected from an alkaline metal halide, an alkaline earth metal halide, and a rare earth metal halide.

For example, the hole control layer may include at least one selected from LiF, NaF, KF, RbF, CsF, LiI, NaI, KI, RbI, and CsI. However, embodiments are not limited thereto.

The emission layer 130 may include a third perovskite compound with or without a neutral defect. The third perovskite compound may be defined the same as the above-described first perovskite compound, except for the presence or not of a neutral defect. A hole concentration of the third perovskite compound may be from about $1.0 \times 10^{16}$ to about $9 \times 10^{18}$ cm$^{-3}$ at about 25° C., and an electron concentration of the third perovskite compound may be from about $1.0 \times 10^{16}$ to about $9 \times 10^{18}$ cm$^{-3}$ electron concentration at about 25° C. For example, the third perovskite compound may have a concentration ratio of hole to electron of about 10:1 to 1:10 at about 25° C. However, embodiments are not limited thereto.

In some embodiments, the emission layer 130 may include a quantum dot including a Group II-VI compound semiconductor. For example, the emission layer 130 may include a nanocrystal of a Group II-VI compound semiconductor, for example, CdS, CdSe, CdTe, ZnS, ZnSe, ZnTe, HgS, HgTe, or any combination thereof. However, embodiments are not limited thereto.

In some embodiments, the emission layer 130 may include an organic material. The emission layer 130 may include an organic host and an organic dopant. The organic dopant may include at least one of a phosphorescent dopant and a fluorescent dopant.

For example, the organic host may be selected from 9,10-di(2-naphthyl)anthracene (ADN), 2-methyl-9,10-bis (naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), and 1,3,5-tri(carbazol-9-yl)benzene (TCP). However, embodiments are not limited thereto.

For example, the organic dopant may be selected from compounds represented by the following formulae. However, embodiments are not limited thereto.

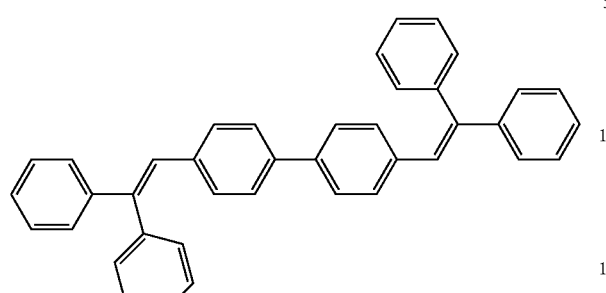

DPVBi

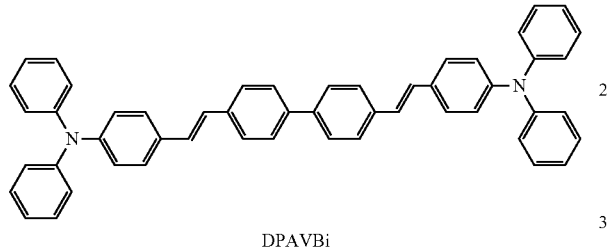

DPAVBi

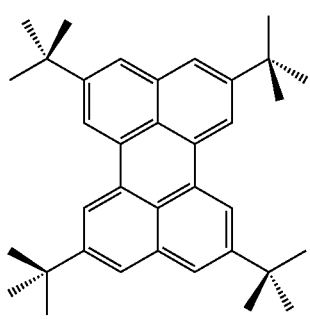

TBPe

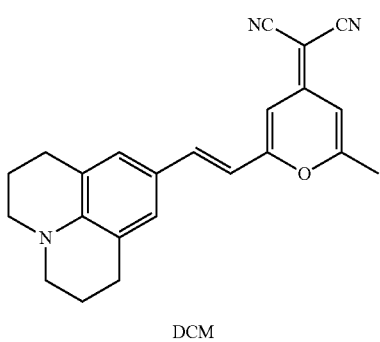

DCM

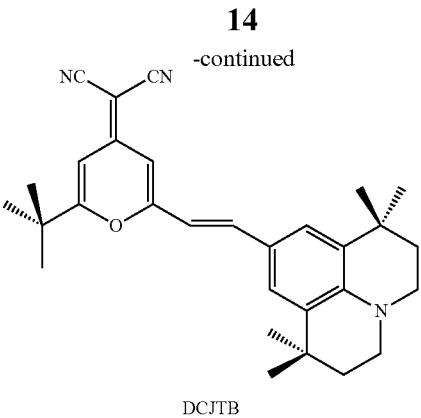

DCJTB

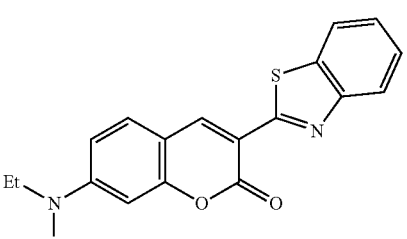

Coumarin 6

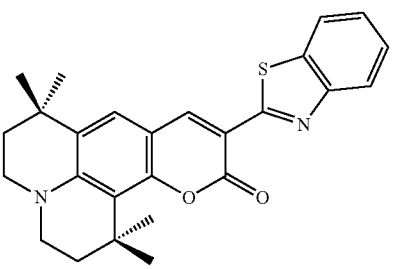

C545T

The amount of the organic dopant in the emission layer 130 may be from about 0.01 parts to about 15 parts by weight based on 100 parts by weight of the organic host. However, embodiments are not limited thereto.

The thickness of the emission layer 130 may be about 100 Å to about 1,000 Å, and in some embodiments, may be from about 200 Å to about 600 Å. When the thickness of the emission layer 130 is within these ranges, the emission layer 130 may have improved light-emitting ability without a substantial increase in driving voltage.

The electron transport region 140 may have i) a single-layer structure including a single layer consisting of a single material, ii) a single-layer structure including a single layer consisting of a plurality of different materials, or iii) a multi-layer structure including a plurality of layers consisting of different materials.

The electron transport region 140 may include at least one layer selected from a buffer layer, a hole blocking layer, an electron control layer, an electron transport layer (ETL), and an electron injection layer. However, embodiments are not limited thereto.

For example, the electron transport region 140 may have a structure, for example, a structure of an electron transport layer/electron injection layer, a structure of a hole blocking layer/electron transport layer/electron injection layer, a structure of an electron control layer/electron transport layer, a structure of an electron transport layer/electron control layer, a structure of an electron control layer/electron transport layer/electron injection layer, a structure of a buffer layer/electron transport layer/electron injection layer, or a structure of a first electron control layer/electron transport layer/second electron control layer, wherein the layers may be sequentially stacked in the stated order on the emission layer 13. However, embodiments are not limited thereto.

The electron transport region 140 may include an inorganic material. For example, the inorganic material may include a metal halide, a metal oxide, a metal chalcogenide, a metal selenide, or any combination thereof.

In some embodiments, the inorganic material may include a Group IV compound semiconductor (for example, silicon carbide), a Group III-V semiconductor (for example, gallium arsenide), a Group II-VI semiconductor (for example, cadmium selenide), a Group I-VII semiconductor (for example, copper (I) chloride, or CuI), a Group IV-VI semiconductor (for example, lead selenide), a Group V-VI semiconductor (for example, bismuth telluride), a Group II-V semiconductor (for example, cadmium arsenide), a ternary or quaternary semiconductor (for example, copper indium selenide, copper indium gallium diselenide, copper zinc tin sulphide (CZTS), or copper zinc tin sulphide selenide (CZTSSe)), or any combination thereof. However, embodiments are not limited thereto.

In some mother embodiments, the inorganic material may include: an oxide of titanium, niobium, tin, zinc, cadmium, copper, lead, or any combination thereof (for example, an alloy thereof); a chalcogenide (for example, copper sulphide, or iron sulphide) of antimony, copper, zinc, iron, bismuth, or any combination thereof (for example, an alloy thereof); a copper zinc tin chalcogenide (for example, copper zinc tin sulphide such as $Cu_2ZnSnS_4$ (CZTS), or copper zinc tin sulfur selenide such as $Cu_2ZnSn(Si_{1-x}Se_x)_4$ (CZTSSe)); a copper indium chalcogenide such as copper indium selenide (CIS); a copper indium gallium selenide such as copper indium gallium selenide ($CuIn_{1-x}Ga_xSe_2$) (CICS); a copper indium gallium diselenide; or any combination thereof, wherein x may be a real number greater than 0 to smaller than or equal to 1. However, embodiments are not limited thereto.

In some embodiments, the electron transport region 140 may include a second perovskite compound with a neutral defect, which is to be described later.

In some embodiments, the electron transport region 140 may include an organic material.

For example, the organic material that may be used in the electron transport region 140 may be a metal-free compound having at least one π electron-depleted nitrogen-containing ring. The "π electron-depleted nitrogen-containing ring", as a ring-forming moiety, may refer to a $C_1$-$C_{60}$ heterocyclic group having at least one *—N=*' moiety.

For example, the "π electron-depleted nitrogen-containing ring" may be i) a 5-membered to 7-membered heteromonocyclic group having at least one *—N=*' moiety, ii) a heteropolycyclic group including at least two of 5-membered to 7-membered heteromonocyclic groups having at least one *—N=*' moiety that are condensed to one another, or iii) a heteropolycyclic group including at least one 5-membered to 7-membered heteromonocyclic group having at least one *—N=*' moiety and at least one $C_5$-$C_{60}$ carbocyclic group that are condensed to one another.

For examples, the organic material that may be used in the electron transport region 140 may be at least one compound selected from 2,9-dimethyl-4,7-diphenyl-1,10-phenanthroline (BCP), 4,7-diphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), NTAZ, and 2,2',2"-(1,3,5-benzinetriyl)-tris(1-phenyl-1-H-benzimidazole) (TPBi). However, embodiments are not limited thereto.

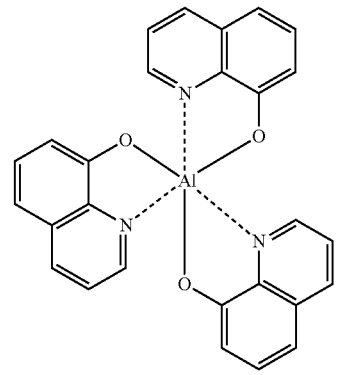

$Alq_3$

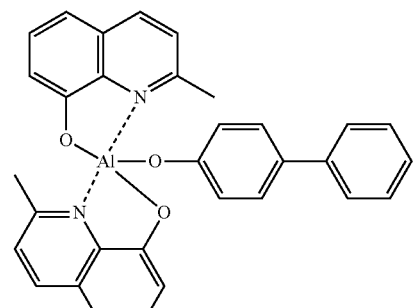

BAlq

-continued

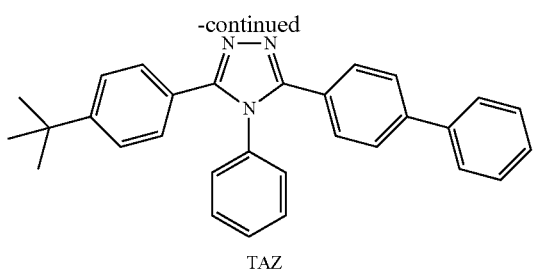

TAZ

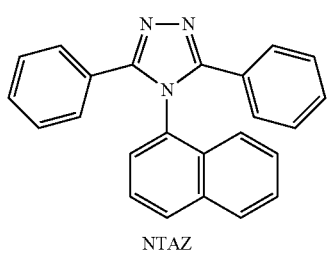

NTAZ

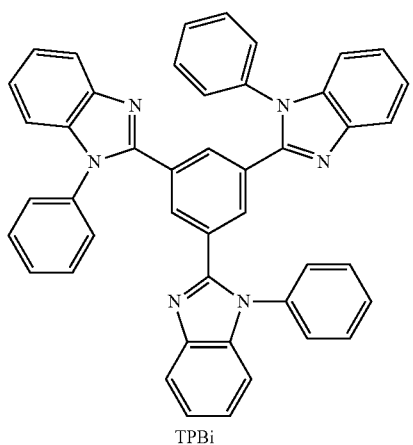

TPBi

The thickness of the electron transport region may be from about 100 Å to about 10,000 Å, and in some embodiments, from about 100 Å to about 1,000 Å. The thickness of the electron transport layer may be from about 100 Å to about 1,000 Å, and in some embodiments, from about 150 Å to about 500 Å. When the thicknesses of the electron transport region and the electron transport layer are within these ranges, satisfactory electron transport characteristics may be obtained without a substantial increase in driving voltage.

The electron control layer may facilitate electron injection at the interface between the emission layer, the electron transport layer, and/or the second electrode, and thus may improved electron-hole balance in the emission layer.

A detailed description of the electron control layer may be substantially the same as those of the hole control layer described above, and thus is not provided here.

The second electrode 150 may be on the electron transport region 140. The second electrode 150 may be a cathode as an electron injection electrode. A material for the second electrode 150 may be a metal, an alloy, or an electrically conductive compound that have a low work function, or a combination thereof.

The second electrode 150 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), silver-magnesium (Ag—Mg), indium thin oxide (ITO), and indium zinc oxide (IZO). However, embodiments are not limited thereto. The second electrode 150 may be a transmissive electrode, a semi-transmissive electrode, or a reflective electrode.

The second electrode 150 may have a single-layer structure including a single layer or a multi-layer structure including a plurality of layers.

The emission layer 130, and the layers in the hole transport region 120, and the layers in the electron transport region 140 may be formed in predetermined regions by using a variety of methods, for example, vacuum deposition, spin coating, casting, Langmuir-Blodgett (LB) deposition, inkjet printing, laser printing, a laser induced thermal imaging (LITI), or the like.

When the emission layer 130, the layers of the hole transport region 120, and the layers of the electron transport region 140 are formed using vacuum deposition, the deposition conditions may include, for example, a deposition temperature of about 100° C. to about 500° C., a pressure of about $10^{-8}$ to about $10^{-3}$ torr, and a deposition rate of about 0.01 to about 100 Å/sec. The deposition conditions may be appropriately selected within these ranges depending on the material and desired structure of a target layer.

When the emission layer 130, the layers of the hole transport region 120, and the layers of the electron transport region 140 are formed using spin coating, the coating conditions may include, for example, a coating rate of about 2000 rpm to about 5000 rpm and a thermal treatment temperature of about 80° C. to 200° C. The coating conditions may be appropriately selected within these ranges depending on the material and desired structure of a target layer.

Hereinafter, a structure of a light-emitting device according to another embodiment and a method of manufacturing the same now will be described with reference to FIG. 2.

Figure 2:
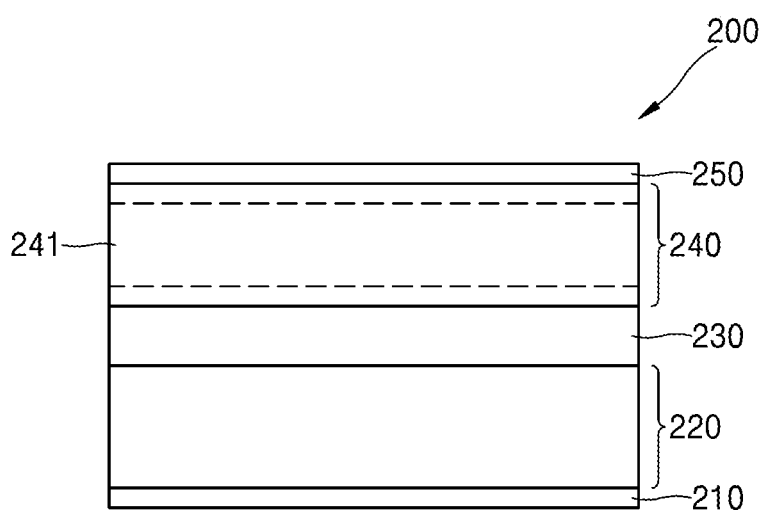
FIG. 2 is a schematic cross-sectional view of a light-emitting device according to another embodiment.

FIG. 2 is a schematic cross-sectional view of a light-emitting device 200 according to another embodiment.

Referring to FIG. 2, a light-emitting device 200 according to an embodiment may include a first electrode 210, a hole transport region 220, an emission layer 230, an electron transport region 240, and a second electrode 250.

Detailed descriptions of the first electrode 210, the hole transport region 220, the emission layer 230, the electron transport region 240, and the second electrode 250 may be substantially the same as those of the first electrode 110, the hole transport region 120, the emission layer 130, the electron transport region 140, and the second electrode 150 described above with reference to FIG. 1, and thus are not provided here.

The hole transport region 220 may include an inorganic material. The inorganic material may be defined the same as described above.

In some embodiments, the hole transport region 220 may include a first perovskite compound with a neutral defect as described above.

In some embodiments, the hole transport region 220 may include an organic material.

For example, the organic material may be m-MTDATA, TDATA, 2-TNATA, NPB (NPD), β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), or polyaniline/poly(4-styrenesulfonate) (Pani/PSS). However, embodiments are not limited thereto.

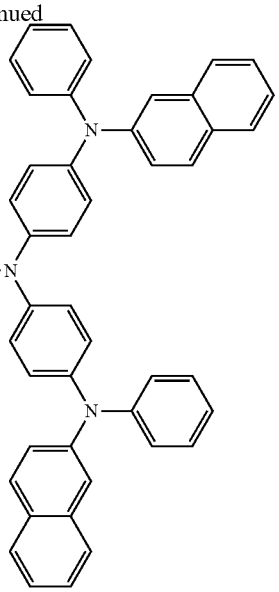

2-TNATA

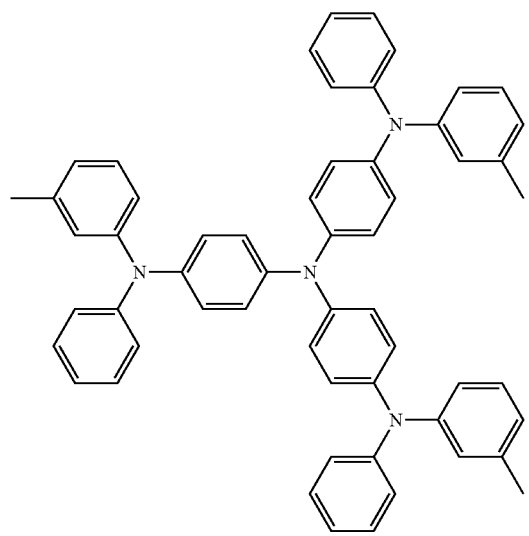

m-MTDATA

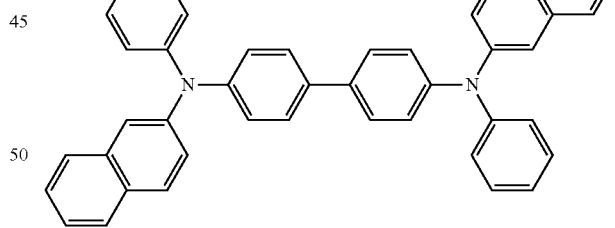

NPB

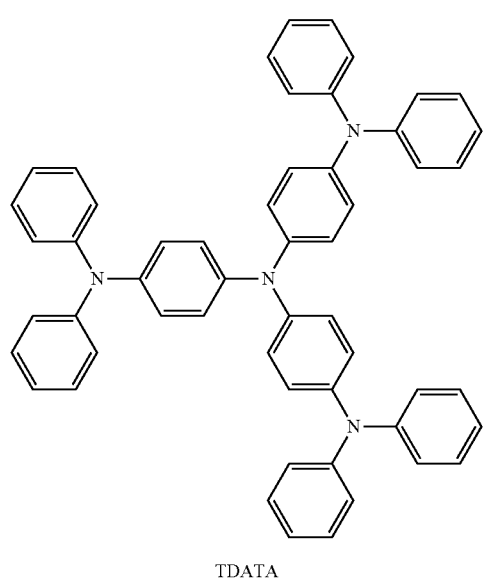

TDATA

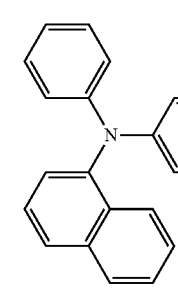

β-NPB

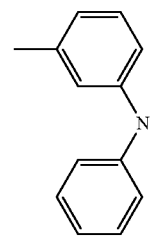

TPD

-continued

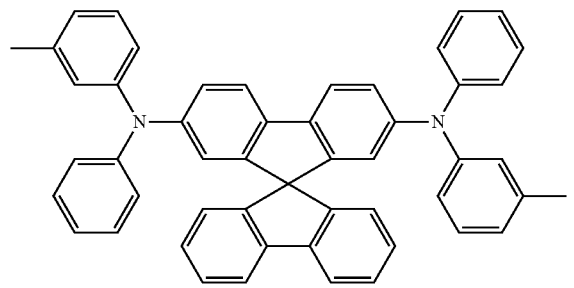

Spiro-TPD

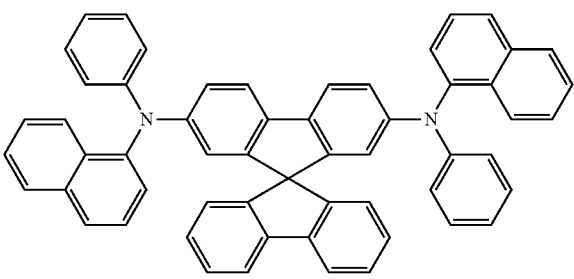

Spiro-NPB

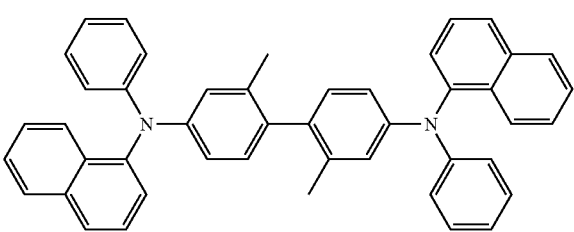

methylated NPD

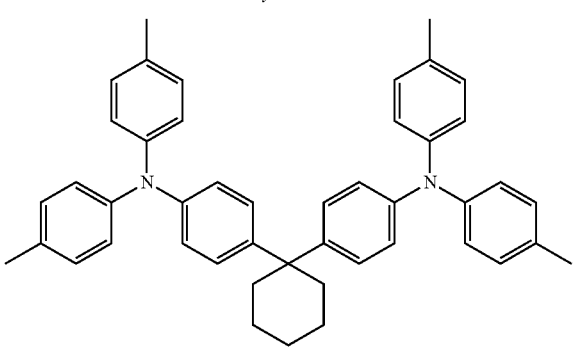

TAPC

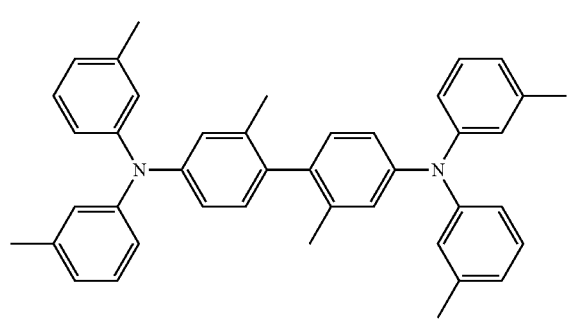

HMTPD

The electron transport region 240 may include an electron transport layer 241. The electron transport region 240 may further include at least one layer selected from a buffer layer, a hole blocking layer, an electron control layer, and an electron injection layer.

The electron transport layer 241 may include a second perovskite compound with a neutral defect.

An electron concentration of the second perovskite compound may be from about $1.0\times10^{16}$ to about $9\times10^{18}$ cm$^{-3}$ at about 25° C. For example, an electron concentration of the second perovskite compound may be from about $1.0\times10^{16}$ to about $9\times10^{17}$ cm$^{-3}$ at about 25° C. However, embodiments are not limited thereto.

When the electron concentration of the second perovskite compound is within these ranges, electron injection barriers may be reduced so that the emission layer 230 may have improved electron-hole balance.

The second perovskite compound may be represented by Formula 2:

$$[A^2{}_o][B^2{}_p][X^2]_{3q} \quad \text{<Formula 2>}$$

In Formula 2, $A^2$ may be at least one monovalent organic cation, at least one monovalent inorganic cation, or any combination thereof, $B^2$ may be $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Lu^{2+}$, or any combination thereof, $X^2$ may be at least one monovalent anion, o, p, and q may be each independently a real number greater than 0 and smaller than or equal to 10, and o+2p=3q.

In Formula 2, $A^2$ may be defined substantially the same as $A^1$ in Formula 1 as described above, $B^2$ may be defined substantially the same as $B^1$ in Formula 1 as described above, and $X^2$ may be defined substantially the same as $X^1$ in Formula 1 as described above, and thus detailed descriptions of $A^2$, $B^2$, and $X^2$ are not provided here.

For example, in Formula 2, o, p, and q may be each independently a real number from about 0.1 to about 3. However, embodiments are not limited thereto.

In some embodiments, in Formula 2, o may be 1, p may be 1, and q may be 3;

o may be 1, p may be 0.5, and q may be 2;

o may be 1, p may be 0.67, and q may be 2.33; or o may be 1, p may be 0.75, q may be 2.5. However, embodiments are not limited thereto.

In some embodiments, the second perovskite compound of Formula 2 may have a neutral defect, and may be selected from $[CH_3NH_3][Eu][I]_3$, $[CH_3NH_3][Pb_rEu_{(1-r)}][I]_3$, $[CH_3NH_3][Pb_rYb_{(1-r)}][I]_3$, $[CH_3NH_3][Pb_rTm_{(1-r)}][I]_3$, $[CH_3NH_3][Pb_rLa_{(1-r)}][I]_3$, $[CH_3NH_3][Pb_rCe_{(1-r)}][I]_3$, $[CH_3NH_3][Pb_rPr_{(1-r)}][I]_3$, $[CH_3NH_3][Pb_rNd_{(1-r)}][I]_3$, $[CH_3NH_3][Pb_rPm_{(1-r)}][I]_3$, $[CH_3NH_3][Pb_rGd_{(1-r)}][I]_3$, $[CH_3NH_3][Pb_rTb_{(1-r)}][I]_3$, $[CH_3NH_3][Pb_rHo_{(1-r)}][I]_3$ and $[CH_3NH_3][Pb_rEr_{(1-r)}][I]_3$;

$[Cs][Pb_rEu_{(1-r)}][I]_3$, $[Cs][Pb_rYb_{(1-r)}][I]_3$, $[Cs][Pb_rTm_{(1-r)}][I]_3$, $[Cs][Pb_rLa_{(1-r)}][I]_3$, $[Cs][Pb_rCe_{(1-r)}][I]_3$, $[Cs][Pb_rPr_{(1-r)}][I]_3$, $[Cs][Pb_rNd_{(1-r)}][I]_3$, $[Cs][Pb_rPm_{(1-r)}][I]_3$, $[Cs][Pb_rGd_{(1-r)}][I]_3$, $[Cs][Pb_rTb_{(1-r)}][I]_3$, $[Cs][Pb_rHo_{(1-r)}][I]_3$ and $[Cs][Pb_rEr_{(1-r)}][I]_3$;

$[CH_3NH_3][Sn_rEu_{(1-r)}][I]_3$, $[CH_3NH_3][Sn_rYb_{(1-r)}][I]_3$, $[CH_3NH_3][Sn_rTm_{(1-r)}][I]_3$, $[CH_3NH_3][Sn_rLa_{(1-r)}][I]_3$, $[CH_3NH_3][Sn_rCe_{(1-r)}][I]_3$, $[CH_3NH_3][Sn_rPr_{(1-r)}][I]_3$, $[CH_3NH_3][Sn_rNd_{(1-r)}][I]_3$, $[CH_3NH_3][Sn_rPm_{(1-r)}][I]_3$, $[CH_3NH_3][Sn_rGd_{(1-r)}][I]_3$, $[CH_3NH_3][Sn_rTb_{(1-r)}][I]_3$, $[CH_3NH_3][Sn_rHo_{(1-r)}][I]_3$ and $[CH_3NH_3][Sn_rEr_{(1-r)}][I]_3$;

[Cs][Sn$_r$Eu$_{(1-r)}$][I]$_3$, [Cs][Sn$_r$Yb$_{(1-r)}$][I]$_3$, [Cs][Sn$_r$Tm$_{(1-r)}$][I]$_3$, [Cs][Sn$_r$La$_{(1-r)}$][I]$_3$, [Cs][Sn$_r$Ce$_{(1-r)}$][I]$_3$, [Cs][Sn$_r$Pr$_{(1-r)}$][I]$_3$, [Cs][Sn$_r$Nd$_{(1-r)}$][I]$_3$, [Cs][Sn$_r$Pm$_{(1-r)}$][I]$_3$, [Cs][Sn$_r$Gd$_{(1-r)}$][I]$_3$, [Cs][Sn$_r$Tb$_{(1-r)}$][I]$_3$, [Cs][Sn$_r$Ho$_{(1-r)}$][I]$_3$ and [Cs][Sn$_r$Er$_{(1-r)}$][I]$_3$;

[Rb][Pb$_r$Eu$_{(1-r)}$][I]$_3$, [Rb][Pb$_r$Yb$_{(1-r)}$][I]$_3$, [Rb][Pb$_r$Tm$_{(1-r)}$][I]$_3$, [Rb][Pb$_r$La$_{(1-r)}$][I]$_3$, [Rb][Pb$_r$Ce$_{(1-r)}$][I]$_3$, [Rb][Pb$_r$Pr$_{(1-r)}$][I]$_3$, [Rb][Pb$_r$Nd$_{(1-r)}$][I]$_3$, [Rb][Pb$_r$Pm$_{(1-r)}$][I]$_3$, [Rb][Pb$_r$Gd$_{(1-r)}$][I]$_3$, [Rb][Pb$_r$Tb$_{(1-r)}$][I]$_3$, [Rb][Pb$_r$Ho$_{(1-r)}$][I]$_3$ and [Rb][Pb$_r$Er$_{(1-r)}$][I]$_3$;

[Rb][Sn$_r$Eu$_{(1-r)}$][I]$_3$, [Rb][Sn$_r$Yb$_{(1-r)}$][I]$_3$, [Rb][Sn$_r$Tm$_{(1-r)}$][I]$_3$, [Rb][Sn$_r$La$_{(1-r)}$][I]$_3$, [Rb][Sn$_r$Ce$_{(1-r)}$][I]$_3$, [Rb][Sn$_r$Pr$_{(1-r)}$][I]$_3$, [Rb][Sn$_r$Nd$_{(1-r)}$][I]$_3$, [Rb][Sn$_r$Pm$_{(1-r)}$][I]$_3$, [Rb][Sn$_r$Gd$_{(1-r)}$][I]$_3$, [Rb][Sn$_r$Tb$_{(1-r)}$][I]$_3$, [Rb][Sn$_r$Ho$_{(1-r)}$][I]$_3$ and [Rb][Sn$_r$Er$_{(1-r)}$][I]$_3$;

[K][Pb$_r$Eu$_{(1-r)}$][I]$_3$, [K][Pb$_r$Yb$_{(1-r)}$][I]$_3$, [K][Pb$_r$Tm$_{(1-r)}$][I]$_3$, [K][Pb$_r$La$_{(1-r)}$][I]$_3$, [K][Pb$_r$Ce$_{(1-r)}$][I]$_3$, [K][Pb$_r$Pr$_{(1-r)}$][I]$_3$, [K][Pb$_r$Nd$_{(1-r)}$][I]$_3$, [K][Pb$_r$Pm$_{(1-r)}$][I]$_3$, [K][Pb$_r$Gd$_{(1-r)}$][I]$_3$, [K][Pb$_r$Tb$_{(1-r)}$][I]$_3$, [K][Pb$_r$Ho$_{(1-r)}$][I]$_3$ and [K][Pb$_r$Er$_{(1-r)}$][I]$_3$;

[K][Sn$_r$Eu$_{(1-r)}$][I]$_3$, [K][Sn$_r$Yb$_{(1-r)}$][I]$_3$, [K][Sn$_r$Tm$_{(1-r)}$][I]$_3$, [K][Sn$_r$La$_{(1-r)}$][I]$_3$, [K][Sn$_r$Ce$_{(1-r)}$][I]$_3$, [K][Sn$_r$Pr$_{(1-r)}$][I]$_3$, [K][Sn$_r$Nd$_{(1-r)}$][I]$_3$, [K][Sn$_r$Pm$_{(1-r)}$][I]$_3$, [K][Sn$_r$Gd$_{(1-r)}$][I]$_3$, [K][Sn$_r$Tb$_{(1-r)}$][I]$_3$, [K][Sn$_r$Ho$_{(1-r)}$][I]$_3$ and [K][Sn$_r$Er$_{(1-r)}$][I]$_3$;

[CH$_3$NH$_3$][Tm$_r$Eu$_{(1-r)}$][I]$_3$, [CH$_3$NH$_3$][Tm$_r$Yb$_{(1-r)}$][I]$_3$, [CH$_3$NH$_3$][Tm$_r$Tm$_{(1-r)}$][I]$_3$, [CH$_3$NH$_3$][Tm$_r$La$_{(1-r)}$][I]$_3$, [CH$_3$NH$_3$][Tm$_r$Ce$_{(1-r)}$][I]$_3$, [CH$_3$NH$_3$][Tm$_r$Pr$_{(1-r)}$][I]$_3$, [CH$_3$NH$_3$][Tm$_r$Nd$_{(1-r)}$][I]$_3$, [CH$_3$NH$_3$][Tm$_r$Pm$_{(1-r)}$][I]$_3$, [CH$_3$NH$_3$][Tm$_r$Gd$_{(1-r)}$][I]$_3$, [CH$_3$NH$_3$][Tm$_r$Tb$_{(1-r)}$][I]$_3$, [CH$_3$NH$_3$][Tm$_r$Ho$_{(1-r)}$][I]$_3$ and [CH$_3$NH$_3$][Tm$_r$Er$_{(1-r)}$][I]$_3$; and

[Cs][Tm$_r$Eu$_{(1-r)}$][I]$_3$, [Cs][Tm$_r$Yb$_{(1-r)}$][I]$_3$, [Cs][Tm$_r$Tm$_{(1-r)}$][I]$_3$, [Cs][Tm$_r$La$_{(1-r)}$][I]$_3$, [Cs][Tm$_r$Ce$_{(1-r)}$][I]$_3$, [Cs][Tm$_r$Pr$_{(1-r)}$][I]$_3$, [Cs][Tm$_r$Nd$_{(1-r)}$][I]$_3$, [Cs][Tm$_r$Pm$_{(1-r)}$][I]$_3$, [Cs][Tm$_r$Gd$_{(1-r)}$][I]$_3$, [Cs][Tm$_r$Tb$_{(1-r)}$][I]$_3$, [Cs][Tm$_r$Ho$_{(1-r)}$][I]$_3$ and [Cs][Tm$_r$Er$_{(1-r)}$][I]$_3$, wherein r may be a real number from 0.1 to 1. However, embodiments are not limited thereto.

The second perovskite compound may include essentially a lanthanum-based metal, for example, Eu. The lanthanum-based metal may be present as a divalent cation or trivalent cation in the second perovskite compound, and thus may improve electrical conductivity of the second perovskite compound.

The second perovskite compound represented by Formula 2 may have any form, not limited to a specific form. For example, the second perovskite compound represented by Formula 2 may be in the form of nanoparticles, nanowires, a nanolayer, multiple nanolayers, microparticles, microwires, a microlayer, or multiple microlayers.

A method of forming the electron transport layer 241 including the second perovskite compound represented by Formula 2 may be substantially the same as the above-described method of forming the hole transport layer 121, and thus is not described in detail here.

The neutral defect the second perovskite compound represented by Formula 2 may be controlled by adjustment of a mole ratio of (A$^2$)(X$^2$) and (B$^2$)(X$^2$)$_2$ during forming the electron transport layer 241. For example, the second perovskite compound represented by Formula 2 may have a neutral defect selected from the above-described types of (c), (d), (e), (h), (i), and (j) by adjusting a molar ratio of (A$^2$)(X$^2$) to (B$^2$)(X$^2$)$_2$) to be larger than 1.

Hereinafter, a structure of a light-emitting device according to another embodiment and a method of manufacturing the same now will be described with reference to FIG. 3.

Figure 3:
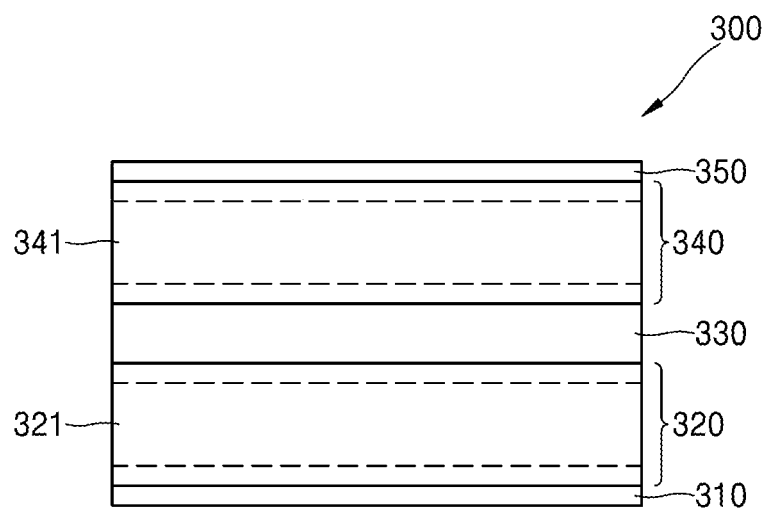
FIG. 3 is a schematic cross-sectional view of a light-emitting device according to another embodiment.

FIG. 3 is a schematic cross-sectional view of a light-emitting device 300 according to another embodiment.

Referring to FIG. 3, a light-emitting device 300 according to an embodiment may include a first electrode 310, a hole transport region 320, an emission layer 330, an electron transport region 340, and a second electrode 350.

Detailed descriptions of the first electrode 310, the hole transport region 320, the emission layer 330, the electron transport region 340, and the second electrode 350 may be substantially the same as those of the first electrode 110, the hole transport region 120, the emission layer 130, the electron transport region 140, and the second electrode 150 described above with reference to FIG. 1, and thus are not provided here.

The hole transport region 320 may include a hole transport layer 321. The hole transport region 320 may further include at least one layer selected from a hole injection layer, an emission auxiliary layer, an electron blocking layer, and a hole control layer.

The hole transport layer 321 may include a first perovskite compound with a neutral defect as described above. A hole concentration of the first perovskite compound may be from about $1.0 \times 10^{16}$ to about $9 \times 10^{18}$ cm$^{-3}$ at about 25° C., and the first perovskite compound may be represented by Formula 1.

The electron transport region 340 may include an electron transport layer 341. The electron transport region 340 may further include at least one layer selected from a buffer layer, a hole blocking layer, an electron control layer, and an electron injection layer.

The electron transport layer 341 may include a second perovskite compound with a neutral defect as described above. An electron concentration of the second perovskite compound may be from about $1.0 \times 10^{16}$ to about $9 \times 10^{18}$ cm$^{-3}$ at about 25° C., and the second perovskite compound may be represented by Formula 2.

One or more embodiments of layers and light-emitting devices according to the present disclosure will now be described in detail with reference to the following examples. However, these examples are only for illustrative purposes and are not intended to limit the scope of the one or more embodiments of the present disclosure.

EXAMPLES

Preparation Example 1

CH$_3$NH$_3$I and EuI$_2$ were co-deposited on a glass substrate in a mole ratio of about 1:0.2 to form a precursor-containing layer including CH$_3$NH$_3$I and EuI$_2$, followed by thermal treatment at about 100° C. for about 15 minutes to form a layer including (CH$_3$NH$_3$)(Eu)I$_3$ with a thickness of about 40 nm. The resulting layer was analyzed by X-ray photoelectron spectroscopy (XPS).

Preparation Example 2

A layer including (CH$_3$NH$_3$)(Eu)I$_3$ with a thickness of about 40 nm was formed in the same manner as in Preparation Example 1, except that a precursor-containing layer including CH$_3$NH$_3$I and EuI$_2$ in a mole ratio of about 1:0.4 was formed on a glass substrate. The resulting layer was analyzed by XPS.

Preparation Example 3

A layer including (CH$_3$NH$_3$)(Eu)I$_3$ with a thickness of about 40 nm was formed in the same manner as in Preparation Example 1, except that a precursor-containing layer including $CH_3NH_3I$ and $EuI_2$ in a mole ratio of about 1:1 was formed on a glass substrate. The resulting layer was analyzed by XPS.

Preparation Example 4

A layer including $(CH_3NH_3)(Eu)I_3$ with a thickness of about 40 nm was formed in the same manner as in Preparation Example 1, except that a precursor-containing layer including $CH_3NH_3I$ and $EuI_2$ in a mole ratio of about 1:1.5 was formed on a glass substrate. The resulting layer was analyzed by XPS.

Comparative Preparation Example 1

A layer including $CsPbI_3$ with a thickness of about 40 nm was formed in the same manner as in Preparation Example 1, except that a precursor-containing layer including CsI and $PbI_2$ in a mole ratio of about 1:1 was formed on a glass substrate.

Comparative Preparation Example 2

A layer including $CH_3NH_3PbI_3$ with a thickness of about 40 nm was formed in the same manner as in Preparation Example 1, except that a precursor-containing layer including $CH_3NH_3I$ and $PbI_2$ in a mole ratio of about 1:1 was formed on a glass substrate.

Evaluation Example 1: Evaluation of Hole/Electron Concentration and Hole/Electron Mobility in Layer Electron or hole concentrations and electron or hole mobilities in the layers of Preparation Examples 1 to 4 and Comparative Preparation Examples 1 and 2 were evaluated using an Ecopia HMS-3000 system. The results are shown in Table 1.

TABLE 1

| Example | Layer composition | Electron concentration ($cm^{-3}$) | Hole concentration ($cm^{-3}$) | Electron mobility ($cm^2/V$) | Hole mobility ($cm^2/V$) |
|---|---|---|---|---|---|
| Preparation Example 1 | 1:0.2 | — | $3.0 \times 10^{16}$ | — | 8.4 |
| Preparation Example 2 | 1:0.4 | $5.1 \times 10^{16}$ | — | 5 | — |
| Preparation Example 3 | 1:1 | $3.9 \times 10^{17}$ | — | 3.9 | — |
| Preparation Example 4 | 1:1.5 | $4.5 \times 10^{18}$ | — | 1.9 | — |
| Comparative Preparation Example 1 | 1:1 | — | $1.2 \times 10^{16}$ | — | 5.2 |
| Comparative Preparation Example 2 | 1:1 | $2.4 \times 10^{17}$ | — | 2.7 | — |

Referring to Table 1, the layer of Preparation Example 1 was found to have a higher hole concentration and a higher hole mobility, compared to those of the layer of Comparative Preparation Example 1. The layers of Preparation Examples 2 to 4 were found to have a higher electron concentration and/or a higher electron mobility compared to those of the layer of Comparative Preparation Example.

Example 1

An ITO glass substrate (available from Corning) having an ITO anode (15 $\Omega/cm^2$, 100 nm) was cut to a size of about 50 mm×50 mm×0.5 mm, cleaned by sonication in acetone, isopropyl alcohol, and then deionized water each for about 15 minutes and by irradiation of ultraviolet rays and exposure to ozone for about 30 minutes, and then loaded into a vacuum deposition apparatus.

A hole transport region with a hole transport layer having a thickness of about 40 nm was formed on the ITO anode in the same manner as in Preparation Example 1.

TBADN and DPAVBi were co-deposited on the hole transport region in a weight ratio of about 97:3 to form an emission layer having a thickness of about 30 nm.

TPBi was then deposited on the emission layer to form an electron transport layer having a thickness of about 30 nm. Then, RbI and Yb were co-deposited on the electron transport layer in a weight ratio of about 1:1 to form an electron transport region with an electron injection layer having a thickness of about 1.5 nm.

Next, Ag and Mg were co-deposited on the electron transport region in a weight ratio of about 9:1 to form a cathode having a thickness of about 10 nm, thereby manufacturing a light-emitting device.

Example 2

An ITO glass substrate (available from Corning) having an ITO anode (15 $\Omega/cm^2$, 100 nm) was cut to a size of about 50 mm×50 mm×0.5 mm, cleaned by sonication in acetone, isopropyl alcohol, and then deionized water each for about 15 minutes and by irradiation of ultraviolet rays and exposure to ozone for about 30 minutes, and then loaded into a vacuum deposition apparatus.

CuI was deposited on the ITO anode to form a hole transport region with a hole transport layer having a thickness of about 40 nm.

TBADN and DPAVBi were co-deposited on the hole transport region in a weight ratio of about 97:3 to form an emission layer having a thickness of about 30 nm.

An electron transport region with an electron transport layer was formed on the emission layer in the same manner as in Preparation Example 2.

Next, Ag and Mg were co-deposited on the electron transport region in a weight ratio of about 9:1 to form a cathode having a thickness of about 10 nm, thereby manufacturing a light-emitting device.

Example 3

An ITO glass substrate (available from Corning) having an ITO anode (15 Ω/cm², 100 nm) was cut to a size of about 50 mm×50 mm×0.5 mm, cleaned by sonication in acetone, isopropyl alcohol, and then deionized water each for about 15 minutes and by irradiation of ultraviolet rays and exposure to ozone for about 30 minutes, and then loaded into a vacuum deposition apparatus.

CuI was deposited on the ITO anode to form a hole transport region with a hole transport layer having a thickness of about 40 nm.

TBADN and DPAVBi were co-deposited on the hole transport region in a weight ratio of about 97:3 to form an emission layer having a thickness of about 30 nm.

An electron transport region with an electron transport layer was formed on the emission layer in the same manner as in Preparation Example 3.

Next, Ag and Mg were co-deposited on the electron transport region in a weight ratio of about 9:1 to form a cathode having a thickness of about 10 nm, thereby manufacturing a light-emitting device.

Example 4

An ITO glass substrate (available from Corning) having an ITO anode (15 Ω/cm², 100 nm) was cut to a size of about 50 mm×50 mm×0.5 mm, cleaned by sonication in acetone, isopropyl alcohol, and then deionized water each for about 15 minutes and by irradiation of ultraviolet rays and exposure to ozone for about 30 minutes, and then loaded into a vacuum deposition apparatus.

CuI was deposited on the ITO anode to form a hole transport region with a hole transport layer having a thickness of about 40 nm.

TBADN and DPAVBi were co-deposited on the hole transport region in a weight ratio of about 97:3 to form an emission layer having a thickness of about 30 nm.

An electron transport region with an electron transport layer was formed on the emission layer in the same manner as in Preparation Example 4.

Next, Ag and Mg were co-deposited on the electron transport region in a weight ratio of about 9:1 to form a cathode having a thickness of about 10 nm, thereby manufacturing a light-emitting device.

Comparative Example 1

An organic light-emitting device was manufactured in the same manner as in Example 1, except that the hole transport layer was formed in the same manner as in Comparative Preparation Example 1.

Comparative Example 2

An organic light-emitting device was manufactured in the same manner as in Example 2, except that the hole transport layer was formed in the same manner as in Comparative Preparation Example 2.

Comparative Example 3

An organic light-emitting device was manufactured in the same manner as in Example 1, except that the hole transport layer was formed using an organic compound.

Evaluation Example 1

Current efficiencies at 5 mA/cm² in the light-emitting devices of Examples 1 to 4 and Comparative Examples 1 to 3 were measured using a Keithley Source-Measure Unit (SMU 236) and a PR650 (Spectroscan) Source Measurement Unit (available from Photo Research, Inc.). The results are shown in Table 2.

TABLE 2

| Example | Current efficiency (cd/A) |
|---|---|
| Example 1 | 124 |
| Example 2 | 121 |
| Example 3 | 135 |
| Example 4 | 125 |
| Comparative Example 1 | 101 |
| Comparative Example 2 | 105 |
| Comparative Example 3 | 120 |

Referring to Table 2, the light-emitting devices of Examples 1 to 4 were found to have improved current efficiencies, compared with the light-emitting devices of Comparative Examples 1 to 3.

As described above, according to the one or more embodiments, a light-emitting device including a perovskite compound as described above in a hole transport layer and/or an electron transport layer may have improved current efficiency.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the inventive concept as defined by the following claims.

What is claimed is:
1. A light-emitting device comprising:
a first electrode;
a second electrode opposite to the first electrode;
an emission layer between the first electrode and the second electrode;
a hole transport region between the first electrode and the emission layer; and
an electron transport region between the emission layer and the second electrode,
wherein the hole transport region comprises a hole transport layer, the hole transport layer comprises a first perovskite compound with a neutral defect, a hole concentration of the first perovskite compound is from about $1.0\times10^{16}$ to about $9\times10^{18}$ cm$^{-3}$ at about 25° C., and the first perovskite compound is represented by Formula 1:

$$[A^1{}_l][B^1{}_m][X^1]_n \qquad \text{Formula 1}$$

wherein, in Formula 1, $A^1$ is at least one monovalent organic cation, at least one monovalent inorganic cation, or any combination thereof, $B^1$ is La$^{2+}$, ce$^{2+}$, Pr$^{2+}$, Nd$^{2+}$, Pm$^{2+}$, Eu$^{2+}$, Gd$^{2+}$, Tb$^{2+}$, Ho$^{2+}$, Er$^{2+}$, Tm$^{2+}$, Yb$^{2+}$, Lu$^{2+}$, or any combination thereof, $X^1$ is at least one monovalent anion, l, m, and n are each independently a real number greater than 0 and smaller than or equal to 10, and l+2m=n, and wherein the neutral defect of the first perovskite compound represented by Formula 1 is one selected from the following (a) to (l):

(a) where the unit has a vacancy in which A is absent ($V_A$);
(b) where the unit has a vacancy in which B is absent ($V_B$);
(c) where the unit has a vacancy in which X is absent ($V_X$);
(d) where A is further added to the unit cell (Ai);
(e) where B is further added to the unit cell (Bi);
(f) where X is further added to the unit cell (Xi);
(g) where a B site in the unit cell is substituted by A ($A_B$);
(h) where an A site in the unit cell is substituted by B ($B_A$);
(i) where an X site in the unit cell is substituted by A ($A_X$);
(j) where an X site in the unit cell is substituted by B ($B_X$);
(k) where an A site in the unit cell is substituted by X ($X_A$); and
(l) where a B site in the unit cell is substituted by X ($X_B$), wherein A represents $A^1$ in Formula 1, B represents $B^1$ in Formula 1, and X represents $X^1$ in Formula 1.

2. A light-emitting device comprising:

a first electrode;

a second electrode opposite to the first electrode;

an emission layer between the first electrode and the second electrode;

a hole transport region between the first electrode and the emission layer; and an electron transport region between the emission layer and the second electrode, wherein the electron transport region comprises an electron transport layer, the electron transport layer comprises a second perovskite compound with a neutral defect, an electron concentration of the second perovskite compound is from about $1.0\times10^{16}$ to about $9\times10^{18}$ cm$^{-3}$ at about 25° C., and the second perovskite compound is represented by Formula 2:

$$[A^2{}_o][B^2{}_p][x^2]_q \qquad \text{Formula 2}$$

wherein, in Formula 2, $A^2$ is at least one monovalent organic cation, at least one monovalent inorganic cation, or any combination thereof, $B^2$ is La$^{2+}$, ce$^{2+}$, Pr$^{2+}$, Nd$^{2+}$, Pm$^{2+}$, Eu$^{2+}$, Gd$^{2+}$, Tb$^{2+}$, Ho$^{2+}$, Er$^{2+}$, Tm$^{2+}$, Yb$^{2+}$, Lu$^{2+}$, or any combination thereof, $X^2$ is at least one monovalent anion, o, p, and q are each independently a real number greater than 0 and smaller than or equal to 10, and o+2p=q, and wherein the neutral defect of the second peroyskite compound represented by Formula 2 is one selected from the following (a) to (l):

(a) where the unit has a vacancy in which A is absent ($V_A$);
(b) where the unit has a vacancy in which B is absent ($V_B$);
(c) where the unit has a vacancy in which X is absent ($V_X$);
(d) where A is further added to the unit cell (Ai);
(e) where B is further added to the unit cell (Bi);
(f) where X is further added to the unit cell (Xi);
(g) where a B site in the unit cell is substituted by A ($A_B$);
(h) where an A site in the unit cell is substituted by B ($B_A$);
(i) where an X site in the unit cell is substituted by A ($A_X$);
(j) where an X site in the unit cell is substituted by B ($B_X$);
(k) where an A site in the unit cell is substituted by X ($X_A$); and
(l) where a B site in the unit cell is substituted by X ($X_B$), wherein A represents $A^2$ in Formula 2, B represents $B^2$ in Formula 2, and X represents $X^2$ in Formula 2.

3. A light-emitting device comprising:

a first electrode;

a second electrode opposite to the first electrode;

an emission layer between the first electrode and the second electrode;

a hole transport region between the first electrode and the emission layer; and an electron transport region between the emission layer and the second electrode, wherein the hole transport region comprises a hole transport layer, the electron transport region comprises an electron transport layer, the hole transport layer comprises a first perovskite compound with a neutral defect, the electron transport layer comprises a second perovskite compound with a neutral defect, a hole concentration of the first perovskite compound is from about $1.0\times10^{16}$ to about $9\times10^{18}$ cm$^{-3}$ at about 25° C., the first perovskite compound is represented by Formula 1, an electron concentration of the second perovskite compound is from about $1.0\times10^{16}$ to about $9\times10^{18}$ cm$^{-3}$ at about 25° C., and the second perovskite compound is represented by Formula 2:

$$[A^1{}_l][B^1{}_m]_n \qquad \text{Formula 1}$$

$$[A^2{}_o][B^2{}_p][x^2]_q \qquad \text{Formula 2}$$

wherein, in Formulae 1 and 2, $A^1$ and $A^2$ are each independently at least one monovalent organic cation, at least one monovalent inorganic cation, or any combination thereof, $B^1$ and $B^2$ are each independently La$^{2+}$, Ce$^{2+}$, Pr$^{2+}$, Nd$^{2+}$, Pm$^{2+}$, Eu$^{2+}$, Gd$^{2+}$, Tb$^{2+}$, Ho$^{2+}$, Er$^{2+}$, Tm$^{2+}$, Yb$^{2+}$, Lu$^{2+}$, or any combination thereof, $X^1$ and $X^2$ are each independently at least one monovalent anion, l, m, n, o, p, and q are each independently a real number greater than 0 and smaller than or equal to 10, l+2m=n, and o+2p=q, and wherein the neutral defect of the first perovskite compound represented by Formula 1 and the neutral defect of the second perovskite compound represented by Formula 2 are each independently selected from one of the following (a) to (l):

(a) where the unit has a vacancy in which A is absent ($V_A$);

(b) where the unit has a vacancy in which B is absent ($V_B$);

(c) where the unit has a vacancy in which X is absent ($V_X$);

(d) where A is further added to the unit cell (Ai);

(e) where B is further added to the unit cell (Bi);

(f) where X is further added to the unit cell (Xi);

(g) where a B site in the unit cell is substituted by A ($A_B$);

(h) where an A site in the unit cell is substituted by B ($B_A$);

(i) where an X site in the unit cell is substituted by A ($A_X$);

(j) where an X site in the unit cell is substituted by B ($B_X$);

(k) where an A site in the unit cell is substituted by X ($X_A$); and (l) where a B site in the unit cell is substituted by X ($X_B$), wherein A represents $A^1$ in Formula 1 and $A^2$ in Formula 2, B represents $B^1$ in Formula 1 and $B^2$ in Formula 2, and X represents $X^1$ in Formula 1 and $X^2$ in Formula 2.

4. The light-emitting device of claim 1, wherein the hole transport region further comprises a hole control layer.

5. The light-emitting device of claim 4, wherein the hole control layer is between the first electrode and the hole transport layer, or between the hole transport layer and the emission layer.

6. The light-emitting device of claim 1, wherein the hole transport region further comprises:

a first hole control layer between the first electrode and the hole transport layer; and a second hole control layer between the hole transport layer and the emission layer.

7. The light-emitting device of claim 4, wherein the hole control layer comprises at least one selected from an alkaline metal halide, an alkaline earth metal halide, and a rare earth metal halide.

8. The light-emitting device of claim 2, wherein the electron transport region further comprises an electron control layer.

9. The light-emitting device of claim 8, wherein the electron control layer is between the second electrode and the electron transport layer, or between the electron transport layer and the emission layer.

10. The light-emitting device of claim 2, wherein the electron transport region further comprises:

a first electron control layer between the second electrode and the electron transport layer; and a second electron control layer between the electron transport layer and the emission layer.

11. The light-emitting device of claim 8, wherein the electron control layer comprises at least one selected from an alkaline metal halide, an alkaline earth metal halide, and a rare earth metal halide.

12. The light-emitting device of claim 1, wherein $A^1$ is $(R_1R_2R_3C)^+$, $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a substituted or unsubstituted nitrogen-containing 5-membered cyclic monovalent cation, a substituted or unsubstituted nitrogen-containing 6-membered cyclic monovalent cation, a substituted or unsubstituted 7-membered monovalent cation, $Li^+$, $Na^+$, $K^+$, $Rb^+$, $Cs^+$, $Fr^+$, or any combination thereof, $R_1$ to $R_5$, at least one substituent of the substituted nitrogen-containing 5-membered cyclic monovalent cation, at least one substituent of the substituted nitrogen-containing 6-membered cyclic monovalent cation, and at least one substituent of the substituted 7-membered cyclic monovalent cation are each independently selected from a hydrogen, a deuterium (-D), —F, —Cl, —Br, —I, a hydroxyl group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_6$-$C_{20}$ aryl group, and —$N(Q_1)(Q_2)$, and $Q_1$ and $Q_2$ are each independently selected from a hydrogen, a deuterium, a hydroxyl group, a $C_1$-$C_{20}$ alkyl group, a $C_2$-$C_{20}$ alkenyl group, a $C_2$-$C_{20}$ alkynyl group, a $C_1$-$C_{20}$ alkoxy group, and a $C_6$-$C_{20}$ aryl group.

13. The light-emitting device of claim 1, wherein $A^1$ is $(CH_3NH_3)^+$, $K^+$, $Rb^+$, $Cs^+$, or any combination thereof.

14. The light-emitting device of claim 1, wherein $B^1$ is $Eu^{2+}$.

15. The light-emitting device of claim 1, wherein $X^1$ is $F^-$, $Cl^-$, $Br^-$, $I^-$, or any combination thereof.

16. The light-emitting device of claim 2, wherein $A^2$ is $(R_1R_2R_3C)^+$, $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a substituted or unsubstituted nitrogen-containing 5-membered cyclic monovalent cation, a substituted or unsubstituted nitrogen-containing 6-membered cyclic monovalent cation, a substituted or unsubstituted 7-membered cyclic monovalent cation, $Li^+$, $Na^+$, $K^+$, $Rb^+$, $Cs^+$, $Fr^+$, or any combination thereof, $R_1$ to $R_5$, at least one substituent of the substituted nitrogen-containing 5-membered cyclic monovalent cation, at least one substituent of the substituted nitrogen-containing 6-membered cyclic monovalent cation, and at least one substituent of the substituted 7-membered cyclic monovalent cation are each independently selected from a hydrogen, a deuterium (-D), —F, —Cl, —Br, —I, a hydroxyl group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_6$-$C_{20}$ aryl group, and —$N(Q_1)(Q_2)$, and $Q_1$ and $Q_2$ are each independently selected from a hydrogen, a deuterium, a hydroxyl group, a $C_1$-$C_{20}$ alkyl group, a $C_2$-$C_{20}$ alkenyl group, a $C_2$-$C_{20}$ alkynyl group, a $C_1$-$C_{20}$ alkoxy group, and a $C_6$-$C_{20}$ aryl group.

17. The light-emitting device of claim 2, wherein $A^2$ is $(CH_3NH_3)^+$, $K^+$, $Rb^+$, $Cs^+$, or any combination thereof.

18. The light-emitting device of claim 2, wherein $B^2$ is $Eu^{2+}$.

19. The light-emitting device of claim 2, wherein $X^2$ is $F^-$, $Cl^-$, $Br^-$, $I^-$, or any combination thereof.

20. The light-emitting device of claim 1, wherein the first perovskite compound does not comprise $Pb^{2+}$ and/or $Sn^{2+}$.

21. A light-emitting device comprising:

a first electrode;

a second electrode opposite to the first electrode;

an emission layer between the first electrode and the second electrode;

a hole transport region between the first electrode and the emission layer; and an electron transport region between the emission layer and the second electrode, wherein the hole transport region comprises a hole transport layer, the electron transport region comprises an electron transport layer, i) the hole transport layer comprises a first perovskite compound with a neutral defect, ii) the electron transport layer comprises a second perovskite compound with a neutral defect, or iii) the hole transport layer comprises a first perovskite compound with a neutral defect and the electron transport layer comprises a second perovskite compound with a neutral defect, a hole concentration of the first perovskite compound is from about $1.0 \times 10^{16}$ to about $9 \times 10^{18}$ cm$^{-3}$ at about 25° C., the first perovskite compound is represented by Formula 1, an electron concentration of the second perovskite compound is from about $1.0 \times 10^{16}$ to about $9 \times 10^{18}$ cm$^{-3}$ at about 25° C., and the second perovskite compound is represented by Formula 2:

$$[A^1{}_l][B^1{}_m][X^1]_n \qquad \text{Formula 1}$$

$$[A^2{}_o][B^2{}_p][X^2]_q \qquad \text{Formula 2}$$

wherein, in Formulae 1 and 2, $A^1$ and $A^2$ are each independently at least one monovalent organic cation, at least one monovalent inorganic cation, or any combination thereof, $B^1$ and $B^2$ are each independently $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Lu^{2+}$, or any combination thereof, $X^1$ and $X^2$ are each independently at least one monovalent anion, l, m, o and p are each independently a real number greater than 0 and smaller than 2, n and q are each independently a real number greater than 0 and smaller than 4, l+2m=n, and o+2p=q, and wherein the neutral defect of the first perovskite compound represented by Formula 1 and the neutral defect of the second perovskite compound represented by Formula 2 are each independently selected from one of the following (a) to (l):

(a) where the unit has a vacancy in which A is absent ($V_A$);

(b) where the unit has a vacancy in which B is absent ($V_B$);

(c) where the unit has a vacancy in which X is absent ($V_X$);

(d) where A is further added to the unit cell (Ai);

(e) Where B is further added to the unit cell (Bi);

(f) where X is further added to the unit cell (Xi):

(g) where a B site in the unit cell is substituted by A ($A_B$);

(h) where an A site in the unit cell is substituted by B ($B_A$);

(i) where an X site in the unit cell is substituted by A ($A_X$);

(j) where an X site in the unit cell is substituted by B ($B_X$);

(k) where an A site in the unit cell is substituted by X ($X_A$); and (l) where a B site in the unit cell is substituted by X ($X_B$), wherein A represents $A^1$ in Formula 1 and $A^2$ in Formula 2, B represents $B^1$ in Formula 1 and $B^2$ in Formula 2, and X represents $X^1$ in Formula 1 and $X^2$ in Formula 2.

* * * * *